US012356675B2

(12) United States Patent
Pritchard et al.

(10) Patent No.: US 12,356,675 B2
(45) Date of Patent: Jul. 8, 2025

(54) PLANAR TRANSISTOR DEVICE COMPRISING AT LEAST ONE LAYER OF A TWO-DIMENSIONAL (2D) MATERIAL

(71) Applicant: GLOBALFOUNDRIES U.S. Inc., Malta, NY (US)

(72) Inventors: David Pritchard, Glenville, NY (US); Heng Yang, Rexford, NY (US); Hongru Ren, Mechanicville, NY (US); Neha Nayyar, Clifton Park, NY (US); Manjunatha Prabhu, Clifton Park, NY (US); Elizabeth Strehlow, Malta, NY (US); Salvatore Cimino, Waterford, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 185 days.

(21) Appl. No.: 18/149,239

(22) Filed: Jan. 3, 2023

(65) Prior Publication Data
US 2023/0147981 A1 May 11, 2023

Related U.S. Application Data

(62) Division of application No. 16/548,518, filed on Aug. 22, 2019, now Pat. No. 11,581,430.

(51) Int. Cl.
*H01L 29/06* (2006.01)
*H01L 31/00* (2006.01)
(Continued)

(52) U.S. Cl.
CPC ......... *H10D 48/362* (2025.01); *H10D 62/151* (2025.01); *H10D 62/235* (2025.01)

(58) Field of Classification Search
CPC ............ H01L 27/2454; H01L 29/7827; H01L 21/823487; H01L 21/823885
See application file for complete search history.

(56) References Cited

U.S. PATENT DOCUMENTS 5,285,088 A   2/1994  Sato et al.
5,955,745 A   9/1999  Yamazaki
(Continued)

OTHER PUBLICATIONS

Chhowalla et al.; "Two-dimensional semiconductors for transistors"; Nature Reviews; Nov. 2016; pp. 1-18; vol. 1; Macmillan Publishers Limited.
(Continued)

*Primary Examiner* — Ismail A Muse
(74) *Attorney, Agent, or Firm* — Francois Pagette; Hoffman Warnick LLC

(57) ABSTRACT

A planar transistor device is disclosed including a gate structure positioned above a semiconductor substrate, the semiconductor substrate comprising a substantially planar upper surface, a channel region, a source region, a drain region, and at least one layer of a two-dimensional (2D) material that is positioned in at least one of the source region, the drain region or the channel region, wherein the layer of 2D material has a substantially planar upper surface, a substantially planar bottom surface and a substantially uniform vertical thickness across an entire length of the layer of 2D material in the gate length direction and across an entire width of the layer of 2D material in the gate width direction, wherein the substantially planar upper surface and the substantially planar bottom surface of the layer of 2D material are positioned approximately parallel to a substantially planar surface of the semiconductor substrate.

19 Claims, 25 Drawing Sheets

(51) Int. Cl.
  *H10D 48/36*  (2025.01)
  *H10D 62/13*  (2025.01)
  *H10D 62/17*  (2025.01)

(56) References Cited

U.S. PATENT DOCUMENTS

| | | | |
|---|---|---|---|
| 6,013,930 | A | 1/2000 | Yamazaki et al. |
| 6,150,231 | A | 11/2000 | Muller et al. |
| 7,205,639 | B2 | 4/2007 | Hierlemann et al. |
| 9,252,237 | B2 | 2/2016 | Doornbos et al. |
| 10,672,894 | B2 | 6/2020 | Van Houdt et al. |
| 10,811,411 | B1 | 10/2020 | Shu et al. |
| 10,964,824 | B2 | 3/2021 | Das |
| 2010/0164056 | A1 | 7/2010 | Min et al. |
| 2011/0163289 | A1 | 7/2011 | Zhu |
| 2013/0043535 | A1 | 2/2013 | Anderson et al. |
| 2014/0306184 | A1 | 10/2014 | Ruhl et al. |
| 2015/0122315 | A1 | 5/2015 | Shin et al. |
| 2016/0307926 | A1 | 10/2016 | Baars et al. |
| 2016/0343805 | A1* | 11/2016 | Lee .................. H01L 29/45 |
| 2016/0343891 | A1 | 11/2016 | Heo et al. |
| 2017/0040331 | A1 | 2/2017 | Van Houdt et al. |
| 2017/0098716 | A1 | 4/2017 | Li et al. |
| 2017/0102358 | A1 | 4/2017 | Hoffman |
| 2017/0110564 | A1 | 4/2017 | Kim et al. |
| 2017/0162577 | A1 | 6/2017 | Suk et al. |
| 2017/0179236 | A1 | 6/2017 | Pourtois et al. |
| 2017/0179263 | A1 | 6/2017 | Pourtois et al. |
| 2017/0240428 | A1 | 8/2017 | Ladislaus et al. |
| 2017/0320234 | A1 | 11/2017 | Cross et al. |
| 2018/0040737 | A1 | 2/2018 | Nam et al. |
| 2018/0061665 | A1 | 3/2018 | Meade et al. |
| 2018/0068851 | A1 | 3/2018 | Lin et al. |
| 2018/0083133 | A1 | 3/2018 | Bayram et al. |
| 2018/0093454 | A1 | 4/2018 | Kaner et al. |
| 2018/0151751 | A1 | 5/2018 | Yeh et al. |
| 2018/0151763 | A1 | 5/2018 | Heo et al. |
| 2018/0190833 | A1* | 7/2018 | Yeh .................. H01L 21/31116 |
| 2018/0205038 | A1 | 7/2018 | Kim et al. |
| 2018/0315750 | A1 | 11/2018 | Hoffman |
| 2019/0070840 | A1 | 3/2019 | Hemnani et al. |
| 2019/0074180 | A1 | 3/2019 | Park et al. |
| 2019/0074381 | A1 | 3/2019 | Park et al. |
| 2019/0103488 | A1 | 4/2019 | Hung |
| 2019/0164972 | A1 | 5/2019 | Peng et al. |
| 2019/0165103 | A1 | 5/2019 | Lu et al. |
| 2020/0091306 | A1 | 3/2020 | Heo et al. |
| 2020/0235098 | A1 | 7/2020 | Li et al. |
| 2020/0335637 | A1 | 10/2020 | Das |
| 2022/0052202 | A1 | 2/2022 | Lee et al. |

OTHER PUBLICATIONS

Schwierz et al.; "Two-dimensional materials and their prospects in transistor electronics"; The Royal Society of Chemistry; 2015; pp. 8261-8283; vol. 7.
Roy et al.; "Field-Effect Transistors Built from All Two-Dimensional Material Components"; ACS Nano 2014; pp. 6259-6264; vol. 8; No. 6.
Bistritzer et al.; "Moire bands in twisted double-layer graphene"; PNAS; 108:12233-37; Jul. 26, 2011.
Lee et al.; "Diffracted moire fringes as analysis and alignment tools for multilayer fabrication in soft lithography"; Applied Physics Letters; 86:204101; 2005.
Yamanaka et al.; "STEM Moire Observation of Lattice-Relaxed Germanium Grown on Silicon"; Journal of Materials Science and Chemical Engineering; 5:102-108; 2017.
Zhang et al.; "Interlayer couplings, Moire patterns, and 2D electronic superlattices in MoS2/WSe2 hetero-bilayers"; Science Advances; 3:e1601459; 2017.
Non Final Office Action dated Feb. 24, 2021 for U.S. Appl. No. 16/548,518, filed Aug. 22, 2019; pp. 50.
Non Final Office Action dated May 17, 2021 for U.S. Appl. No. 16/548,518, filed Aug. 22, 2019; pp. 49.
Non Final Office Action dated Mar. 10, 2022 for U.S. Appl. No. 16/548,518, filed Aug. 22, 2019; pp. 34.
Final Office Action dated Sep. 8, 2022 for U.S. Appl. No. 16/548,518, filed Aug. 22, 2019; pp. 31.
Notice of Allowance and Fee(s) Due dated Nov. 15, 2022 for U.S. Appl. No. 16/548,518, filed Aug. 22, 2019; pp. 31.
U.S. Appl. No. 16/548,518, Response to Final Office Action filed Oct. 13, 2022, 15 pages.
U.S. Appl. No. 16/548,518, Response to Office Action filed Mar. 12, 2021, 13 pages.
U.S. Appl. No. 16/548,518, Response to Office Action filed Jun. 10, 2022, 13 pages.
U.S. Appl. No. 16/548,518, Response to Office Action filed Aug. 17, 2021, 17 pages.

* cited by examiner

PLANAR TRANSISTOR DEVICE COMPRISING AT LEAST ONE LAYER OF A TWO-DIMENSIONAL (2D) MATERIAL

CROSS-REFERENCE TO RELATED APPLICATIONS

The present application is a continuation of U.S. patent application Ser. No. 16/548,518, filed Aug. 22, 2019, currently pending. The entire contents of the foregoing is incorporated herein by reference.

BACKGROUND

Field of the Invention

The present disclosure generally relates to various embodiments of a planar transistor device comprising at least one layer of two-dimensional (2D) material and methods of making such transistor devices.

Description of the Related Art

Within the electronics industry, there is a constant demand for reducing the size of semiconductor devices while at the same type improving their performance capabilities. Relatively recently materials that are generally known as two-dimensional (2D) materials have been developed and investigated for use in integrated circuit products. In general, a 2D material is a material having a single-layer structure in which atoms form a predetermined crystal structure. The atoms or molecules within such a single layer of 2D material are bonded together through intermolecular forces (e.g., covalent bonds). Adjacent layers of 2D materials of a stacked structure are coupled to one another through one or more intermolecular forces (e.g., Van der Waals forces). Many of the intrinsic electronic, thermal, optical and mechanical properties of such 2D materials such as graphene exceed, in isolation or combination, that of other materials commonly used in the manufacture of integrated circuit products and various semiconductor devices such as transistors. For example, depending on their chemical structure, single-sheet 2D materials may possess many beneficial properties, such as high mechanical strength, high electronic and thermal conductivity, and/or unique quantum-mechanical effects, etc.

The present disclosure is generally directed to various embodiments of a planar transistor device comprising at least one layer of 2D material and methods of making such transistor devices.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a planar transistor device comprising at least one layer of 2D material and methods of making such transistor devices. One illustrative transistor device disclosed herein includes a gate structure positioned above a semiconductor substrate, the semiconductor substrate comprising a substantially planar upper surface; a channel region; a source region; a drain region; and at least one layer of a two-dimensional (2D) material that is positioned in at least one of the source region, the drain region or the channel region, wherein the at least one layer of 2D material has a substantially planar upper surface, a substantially planar bottom surface and a substantially uniform vertical thickness across an entire length of the at least one layer of 2D material in the gate length direction and across an entire width of the at least one layer of 2D material in the gate width direction, wherein the substantially planar upper surface and the substantially planar bottom surface of the at least one layer of 2D material are positioned approximately parallel to a substantially planar surface of the semiconductor substrate, wherein the gate structure is positioned on a substantially planar upper surface of the semiconductor substrate and wherein the at least one layer of 2D material is positioned across an entirety of the source region and across an entirety of the drain region, wherein a portion of the semiconductor substrate positioned below the gate structure comprises the channel region and wherein the channel region is substantially free of the of the at least one layer of 2D material.

Another illustrative transistor device disclosed herein includes a gate structure positioned above a semiconductor substrate, the semiconductor substrate comprising a substantially planar upper surface; a channel region; a source region; a drain region; and at least one layer of a two-dimensional (2D) material that is positioned in at least one of the source region, the drain region or the channel region, wherein the at least one layer of 2D material has a substantially planar upper surface, a substantially planar bottom surface and a substantially uniform vertical thickness across an entire length of the at least one layer of 2D material in the gate length direction and across an entire width of the at least one layer of 2D material in the gate width direction, wherein the substantially planar upper surface and the substantially planar bottom surface of the at least one layer of 2D material are positioned approximately parallel to a substantially planar surface of the semiconductor substrate; wherein the at least one layer of 2D material extends across an entirety of the source region, an entirety of the channel region and an entirety of the drain region, wherein the at least one layer of 2D material comprises a plurality of layers of 2D material positioned in a vertically stacked arrangement, and wherein the device further comprises a first conductive source/drain contact structure that is conductively coupled to an uppermost layer of the plurality of layers of 2D material in the source region and a second conductive source/drain contact structure that is conductively coupled to an uppermost layer of the plurality of layers of 2D material in the drain region.

Yet another illustrative transistor device disclosed herein includes a gate structure positioned above a semiconductor substrate, the semiconductor substrate comprising a substantially planar upper surface, the gate structure comprising an upper surface, a channel region, a source region, a drain region, a plurality of layers of two-dimensional (2D) material that is positioned across an entirety of the source region and across an entirety of the drain region, wherein the channel region is substantially free of the plurality of layers of 2D material, wherein each of the plurality of layers of 2D material has a substantially planar upper surface, a substantially planar bottom surface and a substantially uniform vertical thickness across an entire length of the plurality of layers of 2D material in the gate length direction and across an entire width of the plurality of layers of 2D material in the gate width direction, wherein the substantially planar upper surface and the substantially planar bottom surface of each of the plurality of layers of 2D material are positioned approximately parallel to the substantially planar upper surface of the semiconductor substrate, wherein an uppermost layer of the plurality of layers of 2D material in the source region and an uppermost layer of the plurality of layers of 2D material in the drain region have an upper surface that is positioned at a level that is above a level of the upper surface of the gate structure; and a sidewall spacer positioned adjacent the gate structure between the plurality of layers of 2D material in the source region and the plurality of layers of 2D material in the drain region.

BRIEF DESCRIPTION OF THE DRAWINGS

The disclosure may be understood by reference to the following description taken in conjunction with the accompanying drawings, in which like reference numerals identify like elements, and in which.

Figure 1:
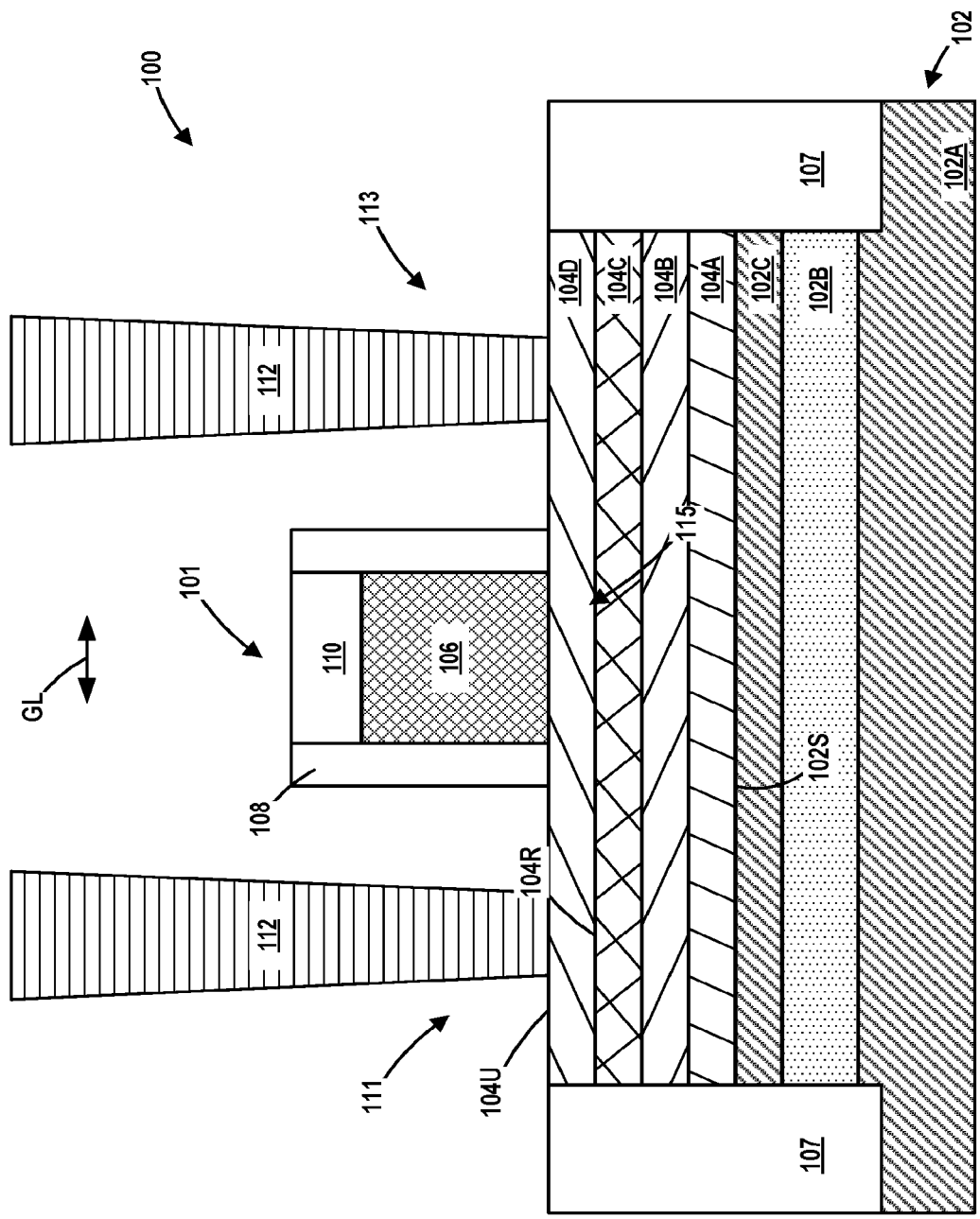
FIGS. 1-28 depict various novel embodiments of a planar transistor device comprising at least one layer of 2D material and various novel methods of making such transistor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-28 depict various novel embodiments of a planar transistor device 100 comprising at least one layer of 2D material and methods of making such planar transistor devices. As will be appreciated by those skilled in the art after a complete reading of the present application, the planar transistor device 100 disclosed herein may be an N-type or P-type device and it may be formed on a bulk semiconductor substrate or a semiconductor-on-insulator substrate. Additionally, the gate structure of the planar transistor device 100 may be manufactured using known gate-first or replacement gate manufacturing techniques. For purposes of disclosure only, the gate structure of the planar transistor device 100 is formed by performing known replacement gate manufacturing techniques. However, as noted above, the various inventions disclosed herein should not be considered to be limited to the particular examples shown in the attached drawings and described below.

FIG. 1 depicts one illustrative embodiment of a planar transistor device 100 disclosed herein that is formed above an illustrative semiconductor-on-insulator (SOI) substrate 102. The planar transistor device 100 has a gate length (GL) that extends in the current transport direction and a gate width (GW) that extends in a direction that is orthogonal (or transverse) to the gate length direction (GL) of the transistor device 100, i.e., the gate width direction extends into and out of the plane of the drawing shown in FIG. 1. The planar transistor devices 100 disclosed herein comprise a source region 111, a drain region 113 and a channel region 115. In some illustrative embodiments disclosed herein, the planar transistor device 100 will formed in and above an upper surface of a substantially rectangular shaped active area defined in a semiconductor substrate and surrounded by isolation material.

The SOI substrate 102 includes a base semiconductor layer 102A, a buried insulation layer 102B and an active semiconductor layer 102C positioned above the buried insulation layer 102B, wherein transistor devices are formed in and above the active semiconductor layer 102C. The base semiconductor layer 102A and the active semiconductor layer 102C may be made of any semiconductor material, e.g., silicon, germanium, silicon-germanium, and they both need not be made of the same semiconductor material, although that may be the case in some applications. The buried insulation layer 102B may be comprised of any of a variety of different insulating materials, e.g., silicon dioxide. The thicknesses of the various layers of the SOI substrate 102 may also vary depending upon the particular application. In some applications, the active semiconductor layer 102C may be substantially un-doped. Of course, as noted above, and shown more fully below, the planar transistor devices 100 disclosed herein may be formed above a bulk semiconductor substrate 103 (described below). Thus, the terms "substrate" or "semiconductor substrate" should be understood to cover all semiconducting materials and all forms of such substrates. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

With continued reference to the illustrative planar transistor device 100 disclosed in FIG. 1, a plurality of 2D material layers 104A-104D (collectively referenced using the numeral 104) are positioned above the upper surface 102S of the SOI substrate 102. In the depicted example, four of the illustrative 2D material layers 104A-104D are formed above the SOI substrate 102 in the general area of the source region 111, the drain region 113 and the channel region 115 of the planar transistor device 100. The methods in which such 2D material layers 104 are formed as well as some illustrative materials for the 2D material layers 104 will be discussed more fully below. In this illustrative example, at least some portion of one or more of the four illustrative 2D material layers 104A-104D (perhaps in combination with the active layer 102C) define the active region for the planar transistor device 100.

Although four illustrative 2D material layers 104A-104D are depicted in FIG. 1, as will be appreciated by those skilled in the art after a complete reading of the present application, in a broader sense, the various embodiments of the planar transistor devices 100 disclosed herein comprise at least one 2D material layer 104. In a more specific example, such one or more 2D material layers 104 may be positioned in at least one of the source region 111, the drain region 113 or the channel region 115 of the planar transistor device 100. Additionally, the terms "source region", "drain region" and "channel region" as used herein and in the attached claims means physical areas or regions of the transistor device 100 and not the actual region, e.g., the actual source region during operation of the planar transistor device 100, as the precise depth of an actual source region, an actual drain region or an actual channel region during operation of a transistor device may vary depending upon a variety of factors. Thus, with respect to the embodiment of the planar transistor device 100 shown in FIG. 1 with the four illustrative 2D material layers 104A-104D positioned in the source region 111, the depth of the actual source region during operation of the planar transistor device 100 may only extend through the 2D material layers 104D and 104C and only partially into the 2D material layer 104B. Nevertheless, all four of the 2D material layers 104A-104D shown in FIG. 1 shall be considered to be positioned in the source region 111 of the planar transistor device 100. The same reasoning and logic applies to the positioning of the four illustrative 2D material layers 104A-104D in the drain region 113 as well as the channel region 115 of the planar transistor device 100.

Also depicted in FIG. 1 is an illustrative isolation structure 107 that extends through the 2D material layers 104A-104D and into the base semiconductor layer 102A of the SOI substrate 102. The isolation structure 107 may be comprised of a variety of different materials, e.g., silicon dioxide, etc., and it may be formed by performing traditional etching, deposition and planarization processes.

As noted above, in the particular example depicted herein, the gate structure of the transistor device 100 will be formed by performing known replacement gate manufacturing techniques. Accordingly, FIG. 1 depicts a sacrificial gate structure 106, a gate cap 110 and a sidewall spacer 108. Collectively, the sacrificial gate structure 106, the gate cap 110 and the sidewall spacer 108 define a gate 101. As is common, the sacrificial gate structure 106 typically comprises a layer of sacrificial gate insulation material (not separately shown), e.g., silicon dioxide, and a layer of sacrificial gate electrode material (not separately shown), e.g., amorphous silicon, polysilicon, etc. The gate cap 110 may be comprised of a material such as silicon nitride. The techniques for forming the sacrificial gate structure 106 and the gate cap 110 are well known to those skilled in the art. After formation of the sacrificial gate structure 106 and the gate cap 110, the simplistically depicted sidewall spacer 108 was formed around and adjacent the entire perimeter of the sacrificial gate structure 106. Although only a single sidewall spacer 108 is depicted in the drawings, in practice, more than one sidewall spacer may be formed adjacent the sacrificial gate structure 106. The sidewall spacer 108 may be formed by depositing a conformal layer of spacer material (not shown) above the substrate 102 and thereafter performing an anisotropic etching process to remove horizontally positioned portions of the layer of spacer material. The spacer 108 may be of any desired thickness (as measured at its base) and it may be comprised of a variety of different materials, e.g., silicon dioxide, a low-k material, silicon nitride, SiCN, SiN, SiCO, and SiOCN, etc. The gate cap 110 may be comprised of a variety of different materials, e.g., silicon nitride.

Also shown in FIG. 1 is a plurality of simplistically depicted and representative conductive source/drain contact structures 112. As depicted, one of the conductive source/drain contact structures 112 is conductively coupled to an uppermost layer of the plurality of 2D material layers 104 positioned in the source region 111, while the other conductive source/drain contact structure 112 is conductively coupled to an uppermost layer of the plurality of 2D material layers 104 positioned in the drain region 113. The conductive source/drain contact structures 112 may take a variety of forms, they may be manufactured using a variety of known techniques, and they may be comprised of a variety of conductive materials, e.g., tungsten, a metal silicide, etc. Of course, various layers of insulating material (not shown) will be formed above the upper surface of the SOI substrate 102 prior to the formation of the conductive source/drain contact structures 112.

As will be appreciated by those skilled in the art after a complete reading of the present application, the 2D material layers 104 disclosed herein may be formed using any known technique for the formation of such 2D material layers 104. For example, the 2D material layers 104 disclosed herein (or vertical stacks of such layers) may be formed using the methods disclosed in U.S. patent applications 20190070840, 20180093454 or 20180205038, the entirety of each of these patent applications is hereby incorporated by reference. Additionally, the 2D material layers 104 disclosed herein (or vertical stacks of such layers) may be produced by layer formation and cleaving techniques that are similar to known techniques for forming SOI substrates which are incorporated. Each of the 2D material layers 104 disclosed herein is a material having a single-layer structure in which the atoms or molecules of the layer 104 form a predetermined crystalline structure. The 2D material layers 104 disclosed herein may comprise a variety of materials, e.g., silicon, silicon germanium, a metal chalcogenide based material, a transition metal dichalcogenide (TMD), graphene, $MoS_2$, $MoSe_2$, $MoTe_2$, $WS_2$, $WSe_2$, $WTe_2$, $HfS_2$, $HfSe_2$, $ZrS_2$, $ZrSe_2$, $NbSe_2$, $ReSe_2$, etc.

In some embodiments, as described more fully below, the 2D material layers 104 disclosed herein may be formed such that the crystalline structure of adjacent layers of the 2D material layers 104 may be rotated (clockwise or counterclockwise) relative to one another. Such rotated 2D material layers 104 may be formed using any technique known in the art, including, for example, the method disclosed in the above-referenced U.S. patent application 20180205038. The thickness of each of the 2D material layers 104 disclosed herein may vary depending upon the particular application, e.g., 1-100 nm. In the case where multiple 2D material layers 104 are arranged in a vertically oriented stack, the thickness and/or material of composition for each of the 2D material layers 104 within the stack may be different from one another. In some applications, all of the 2D material layers 104 in a particular stack of such layers may all have the same approximate thickness and they all may be comprised of the same material, but that may not be the case in all applications. If desired, during the process of forming the 2D material layers 104, N- or P-type dopant materials may be added to each of the 2D material layers 104. In some applications, all of the 2D material layers 104 in a particular stack of such layers may be doped with the same type of dopant (e.g., N or P) but that may not be the case in all applications. Of course, if desired, and depending upon the particular application, some or all of the 2D material layers 104 disclosed herein may be formed in a substantially un-doped condition and dopant material may be subsequently implanted into the 2D material layers 104 disclosed herein.

The 2D material layers 104 disclosed herein are continuous layers of material that have a three dimensional configuration, i.e., a length (in the gate length direction of the planar transistor device 100), a width (in the gate width direction of the planar transistor device 100) and a substantially uniform vertical thickness in a direction that is substantially normal to an upper surface of the substrate, wherein the substantially uniform vertical thickness extends across the entire length and width of the 2D material layer 104. All of the 2D material layers 104 disclosed herein are continuous sheets of material(s) that have an substantially planar upper surface 104U and a substantially planar bottom surface 104R. The substantially planar upper surface 104U and the substantially planar bottom surface 104R of each of the 2D material layers are substantially parallel to one another and both of these surfaces are substantially continuous across the entire length and width of the 2D material layer 104. Additionally, the substantially planar upper surface 104U and the substantially planar bottom surface 104R of each of the 2D material layers 104 disclosed herein is positioned in a substantially parallel relationship with respect to a substantially planar upper surface of the underlying substrate, e.g., the substantially planar upper surface 102S of the active layer 102C of the SOI substrate, the substantially planar upper surface 102BS (see FIG. 2) of the buried insulation layer 102B of the illustrative SOI substrate 102 or the substantially planar upper surface 103S of the bulk semiconductor substrate 103 (see FIG. 3). In one illustrative embodiment (see, e.g., FIGS. 1-4 above and below), the 2D material layers 104 disclosed herein may have a length (left to right in FIG. 1) that spans across the entirety of the source region 111, the entirety of the channel region 115 and the entirety of the drain region 113 and a width that extends for the entire dimension of the active region in the gate width direction. In other embodiments (see, e.g., FIGS. 14 and 15 below), the stacks of the 2D material layers 104 shown therein may only have a length that corresponds approximately to the length of the source region 111 and the drain region 113, and a width that extends for the entire dimension of the active region in the gate width direction. In the example shown in FIG. 1, the upper surface 104U and the bottom surface 104R of each of the 2D material layers 104 is positioned substantially parallel to the upper surface 102S of the active layer 102C of the SOI substrate 102.

Figure 2:
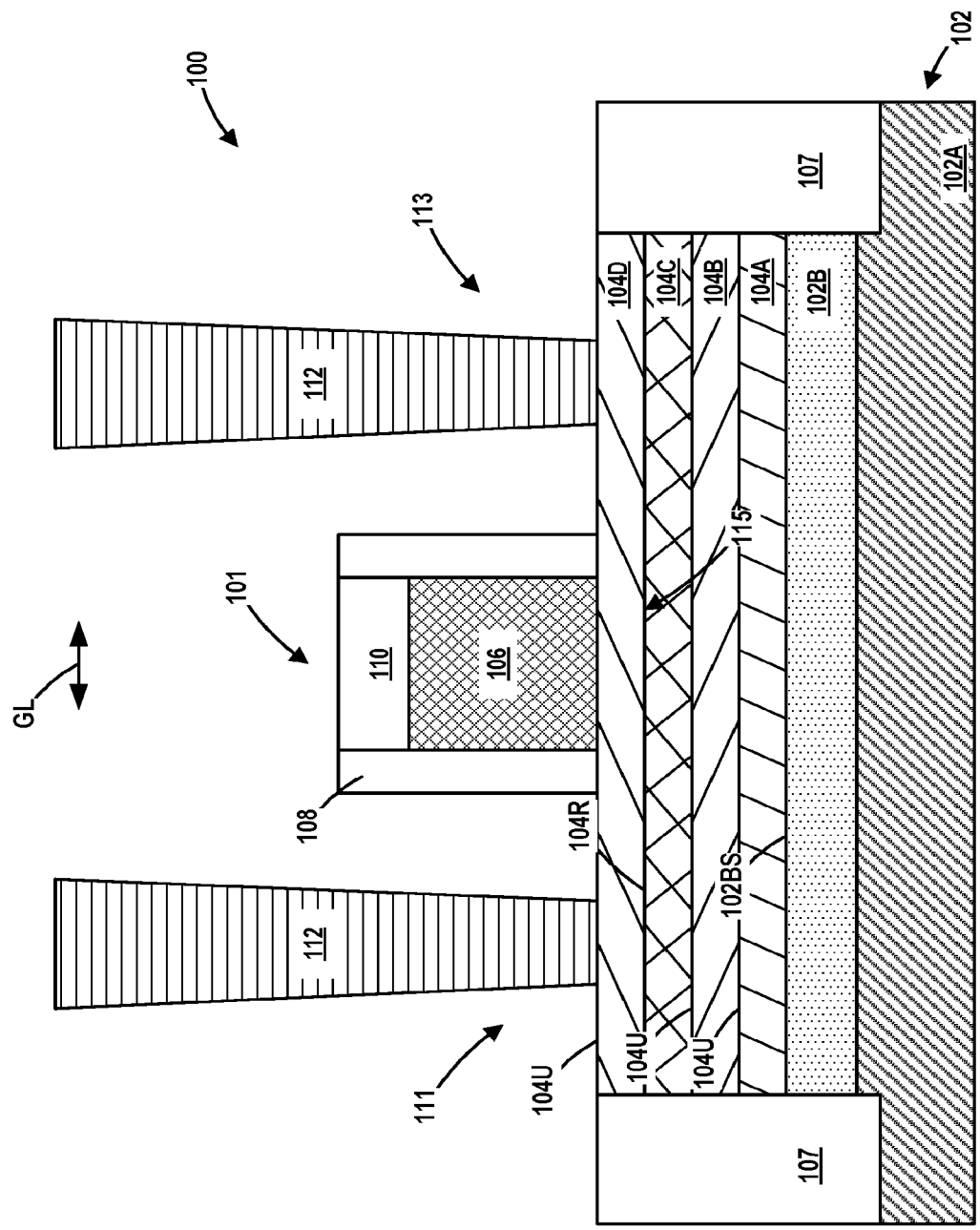

FIG. 2 depicts another illustrative embodiment of a planar transistor device 100 disclosed herein that is similar to the planar transistor device 100 shown in FIG. 1. However, relative to the embodiment shown in FIG. 1, the lowermost 2D material layer 104A of the four illustrative 2D material layers 104A-104D shown in FIG. 2 is formed on and in contact with the upper surface 102BS of the buried insulation layer 102B of the SOI substrate 102. In this illustrative example, at least some portion of one or more of the four illustrative 2D material layers 104A-104D define the active region for the planar transistor device 100. In the example shown in FIG. 2, the upper surface 104U and the bottom surface 104R of each of the 2D material layers 104 is positioned substantially parallel to the upper surface 102BS of the buried insulation layer 102B of the SOI substrate 102.

Figure 3:
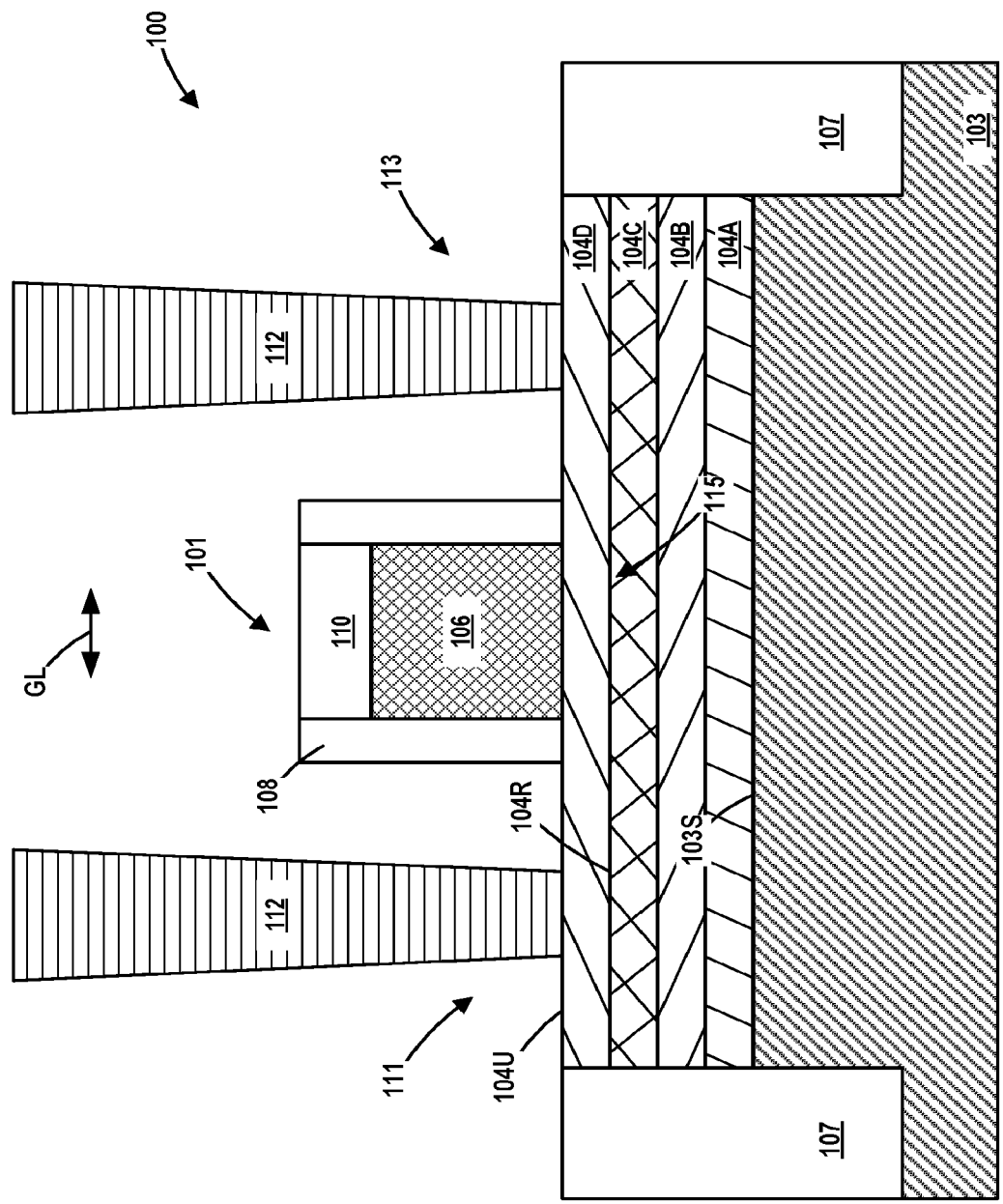

FIG. 3 depicts yet another illustrative embodiment of a planar transistor device 100 disclosed herein that is similar to the planar transistor device 100 shown in FIG. 1. However, relative to the embodiment shown in FIG. 1, the SOI substrate 102 has been replaced with a bulk semiconductor substrate 103. In the planar transistor device 100 shown in FIG. 3, the lowermost 2D material layer 104A of the four illustrative 2D material layers 104A-104D is formed on and in contact with the upper surface 103S of the bulk semiconductor substrate 103. As noted above, the bulk semiconductor substrate 103 may be comprised of any semiconductor material. In this illustrative example, at least some portion of one or more of the four illustrative 2D material layers 104A-104D (perhaps in combination with a portion of the bulk semiconductor substrate 103) define the active region for the planar transistor device 100. In the example shown in FIG. 3, the upper surface 104U and the bottom surface 104R of each of the 2D material layers 104 is positioned substantially parallel to the upper surface 103S of the bulk semiconductor substrate 103.

Figure 4:
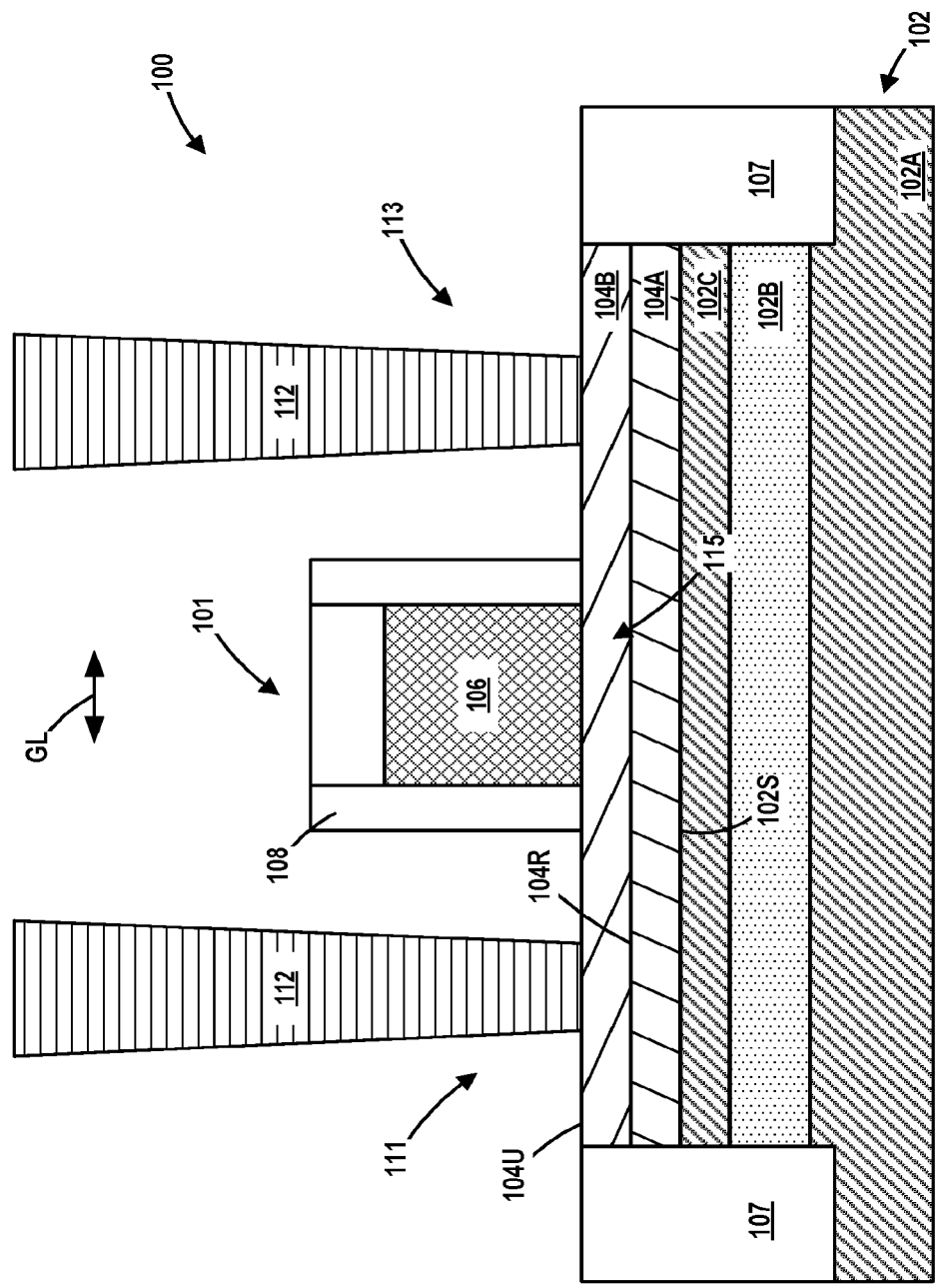

FIG. 4 depicts another illustrative embodiment of a planar transistor device 100 disclosed herein that is similar to the planar transistor device 100 shown in FIG. 1. However, relative to the embodiment shown in FIG. 1, the planar transistor device 100 shown in FIG. 4 comprises only two of the 2D material layers 104-104A and 104B. In this example, the lowermost 2D material layer 104A of the two illustrative 2D material layers 104A-B shown in FIG. 4 is formed on and in contact with the upper surface 102S of the active layer 102C of the SOI substrate 102. Of course, this embodiment with only two of the 2D material layers 104 may be incorporated in the other embodiments of the planar transistor device 100 shown in FIGS. 2 and 3. Moreover, as noted above, the various embodiments of the planar transistor device 100 disclosed herein may only have a single 2D material layer 104. In the example shown in FIG. 4, the upper surface 104U and the bottom surface 104R of each of the 2D material layers 104 is positioned substantially parallel to the upper surface 102S of the active layer 102C of the SOI substrate 102.

Figure 5:
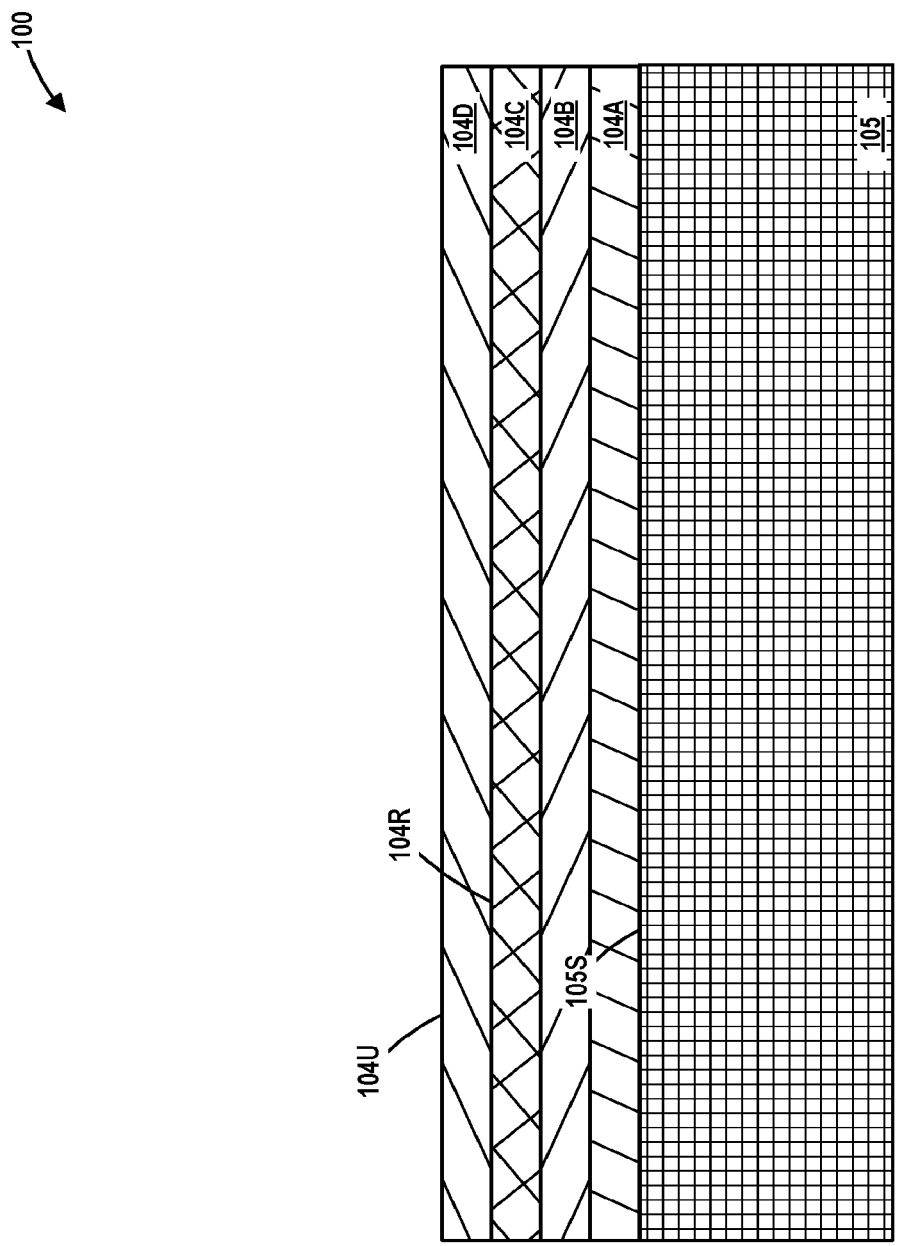
Figure 6:
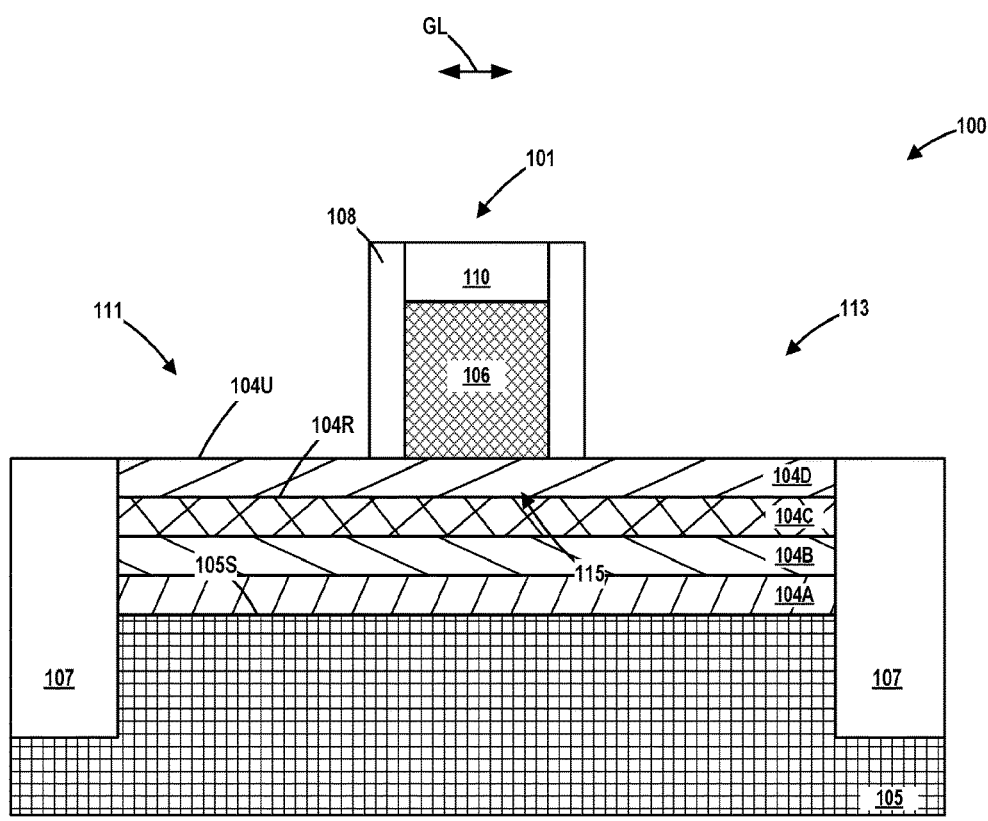
Figure 7:
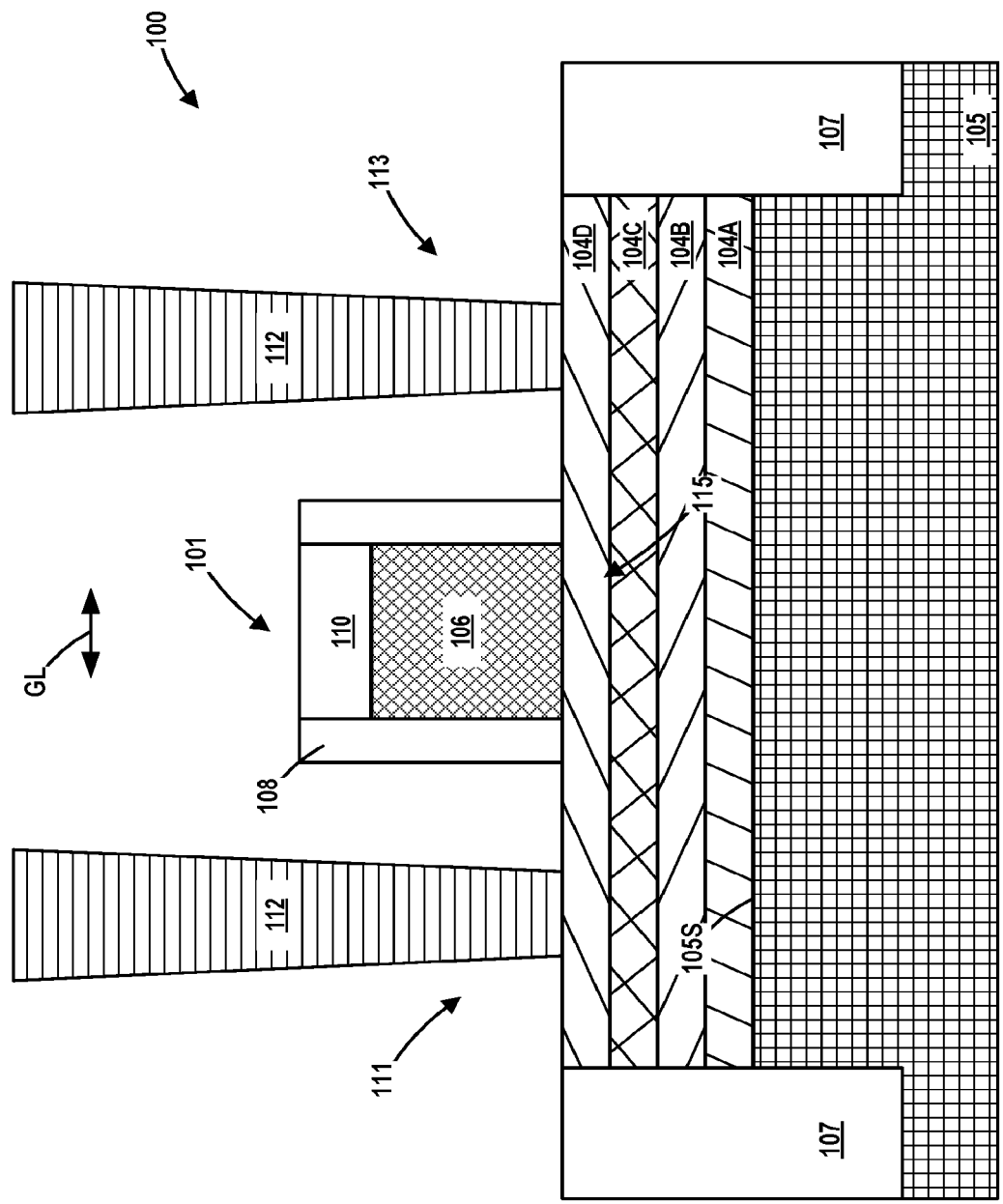

FIGS. 5-7 depict one illustrative process flow for forming the embodiments of the planar transistor device 100 shown in FIGS. 1-3. However, FIGS. 5-7 include a representative substrate 105 that is intended to be representative of either the SOI substrate 102 or the bulk semiconductor substrate 103. Accordingly, the upper surface 105S of the representative substrate 105 should be understood to be representative of the upper surface 102S of the active layer 102C of the SOI substrate 102, the upper surface 102BS of the buried insulation layer 102B of the SOI substrate 102 or the upper surface 103S of the bulk semiconductor substrate 103.

FIG. 5 depicts the device at a point in fabrication where the four illustrative 2D material layers 104A-104D are positioned above the upper surface 105S of the representative substrate 105. In one illustrative process flow, the structure depicted in FIG. 5 may be produced by layer formation and cleaving techniques that are similar to known techniques for forming SOI substrates.

FIG. 6 depicts the planar transistor device 100 after several process operations were performed. First, the above-described isolation structure 107 was formed by performing traditional etching, deposition and planarization processes. Next, the above-described gate 101 was formed above the uppermost 2D material layer 104D using traditional manufacturing techniques. Thereafter, in one illustrative embodiment, one or more ion implantation processes were performed to form doped source/drain regions (not shown) that extend into one or more of the four illustrative 2D material layers 104A-104D. Other implant regions (not shown) may also be formed in the one or more of the 2D material layers 104, e.g., halo implant regions. At some point in the process flow, the sacrificial gate structure 106 may be removed and the final gate structure (not shown) for the planar transistor device 100 may be formed by performing known replacement gate processing techniques.

FIG. 7 depicts the planar transistor device 100 after the above-described conductive source/drain contact structures 112 were formed on the planar transistor device 100. Of course, various layers of insulating material (not shown) were formed above the upper surface 105S of the representative substrate 105 prior to the formation of the conductive source/drain contact structures 112.

Figure 8:
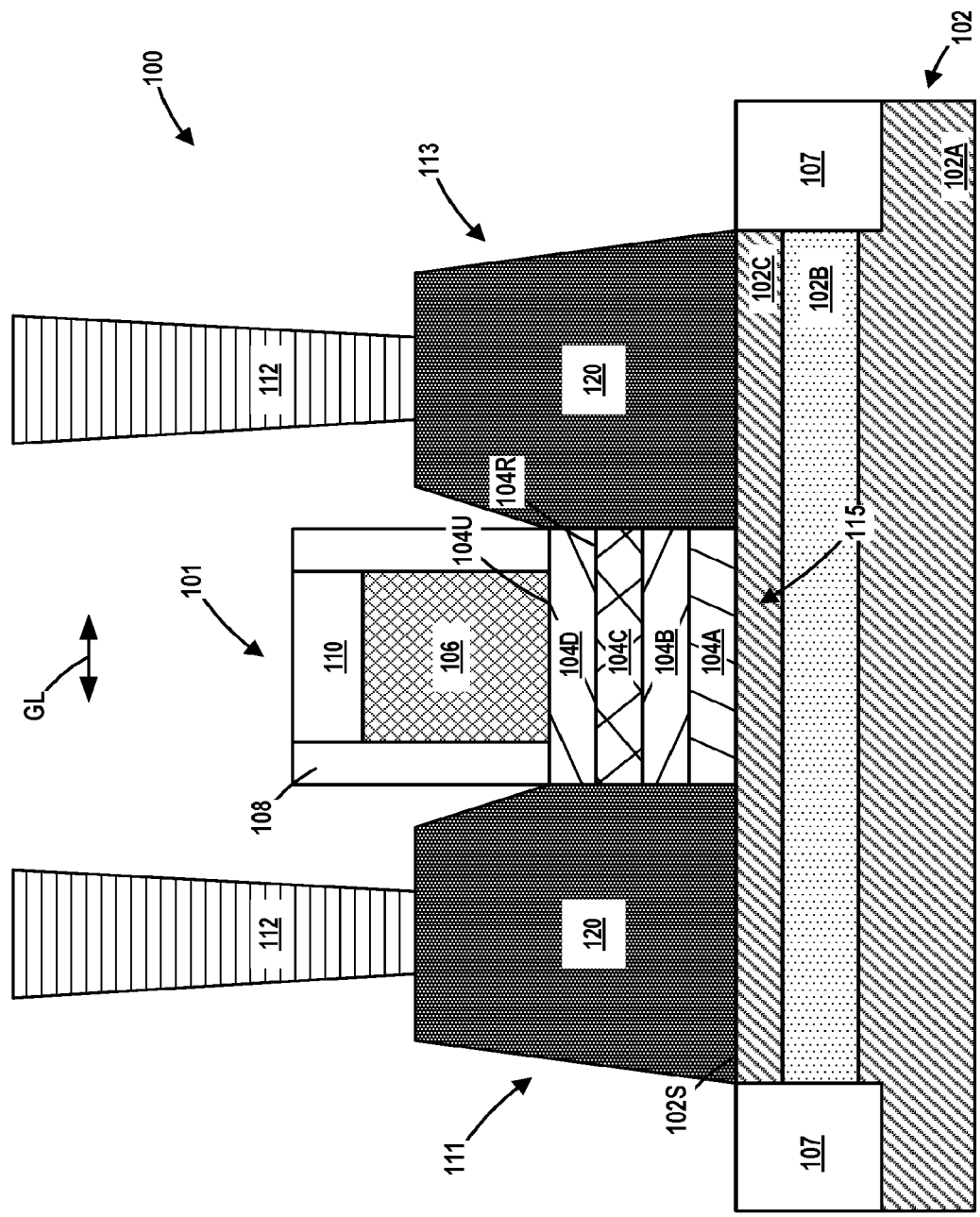

FIG. 8 depicts yet another embodiment of a planar transistor device 100 disclosed herein that is formed above the upper surface 102S of the SOI substrate 102. In the depicted example, four of the illustrative 2D material layers 104A-104D are formed above the SOI substrate 102. In the completed device, the four of the illustrative 2D material layers 104A-104D are positioned only in the general area of the channel region 115 of the planar transistor device 100, i.e., the source region 111 and the drain region 113 are substantially free of the illustrative 2D material layers 104A-104D. In this illustrative example, at least some portion of one or more of the four illustrative 2D material layers 104A-104D (perhaps in combination with the active layer 102C) define the channel region 115 for the planar transistor device 100. The methods in which this embodiment of the transistor 100 may be formed are discussed more fully below.

Although four illustrative 2D material layers 104A-104D are depicted in FIG. 8, as discussed above, the various embodiments of the planar transistor devices 100 disclosed herein may comprise only one 2D material layer 104. Also depicted in FIG. 8 is the above-described isolation structure 107 that extends through active layer 102C and the buried insulation layer 102B of the SOI substrate 102, as well as the above-described sacrificial gate structure 106, gate cap 110 and sidewall spacer 108.

Also shown in FIG. 8 is a plurality of simplistically depicted and representative regions of epi semiconductor material 120 that were formed in the source region 111 and the drain region 113 of the device 100. In some embodiments, a plurality of epi cavities (not shown) may be formed in the substrate 102 prior to the formation of the epi semiconductor material 120. However, the illustrative examples depicted herein do not involve the formation of such epi cavities. As shown in FIG. 8, the source/drain epi semiconductor material 120 was formed using the upper surface 102S of the active layer 102C as well as the exposed end surfaces of the 2D material layers 104 as the growth surfaces for the epi semiconductor material 120. The regions of epi semiconductor material 120 conductively contact the edges of each of the plurality of 2D material layers 104. Additionally, in this particular example, the regions of epi semiconductor material 120 are positioned on and in contact with the upper surface 102S of the active layer 102C.

The source/drain epi semiconductor material 120 may be formed by performing traditional epitaxial semiconductor growth processes. The source/drain epi semiconductor material 120 may be comprised of a variety of different materials and different source/drain epi semiconductor materials 120 may be formed on different type devices, e.g., silicon (Si), silicon germanium (SiGe), etc., for P-type devices, silicon, silicon-carbide (SiC), etc., for N-type devices. In other applications, the source/drain epi semiconductor material 120 may be the same material for both types of devices, e.g., silicon for both the N- and P-type devices. The physical size or volume of the epi semiconductor material 120 that is formed may vary depending upon the particular application. In one illustrative process flow, the regions of epi semiconductor material 120 may be doped with a particular type of dopant (N or P) as it is grown, i.e., it may be doped in situ. In other applications, the epi semiconductor material 120 may be initially formed as substantially un-doped epi material and thereafter doped with the appropriate dopant atoms by performing one or more ion implantation processes. In even other applications, even if the epi semiconductor material is initially doped in situ, additional dopant material may be added to the regions of epi semiconductor material 120 by way of ion implantation. Lastly, also shown in FIG. 8 are the above-described conductive source/drain contact structures 112 that are conductively coupled to the regions of epi semiconductor material 120.

Figure 9:
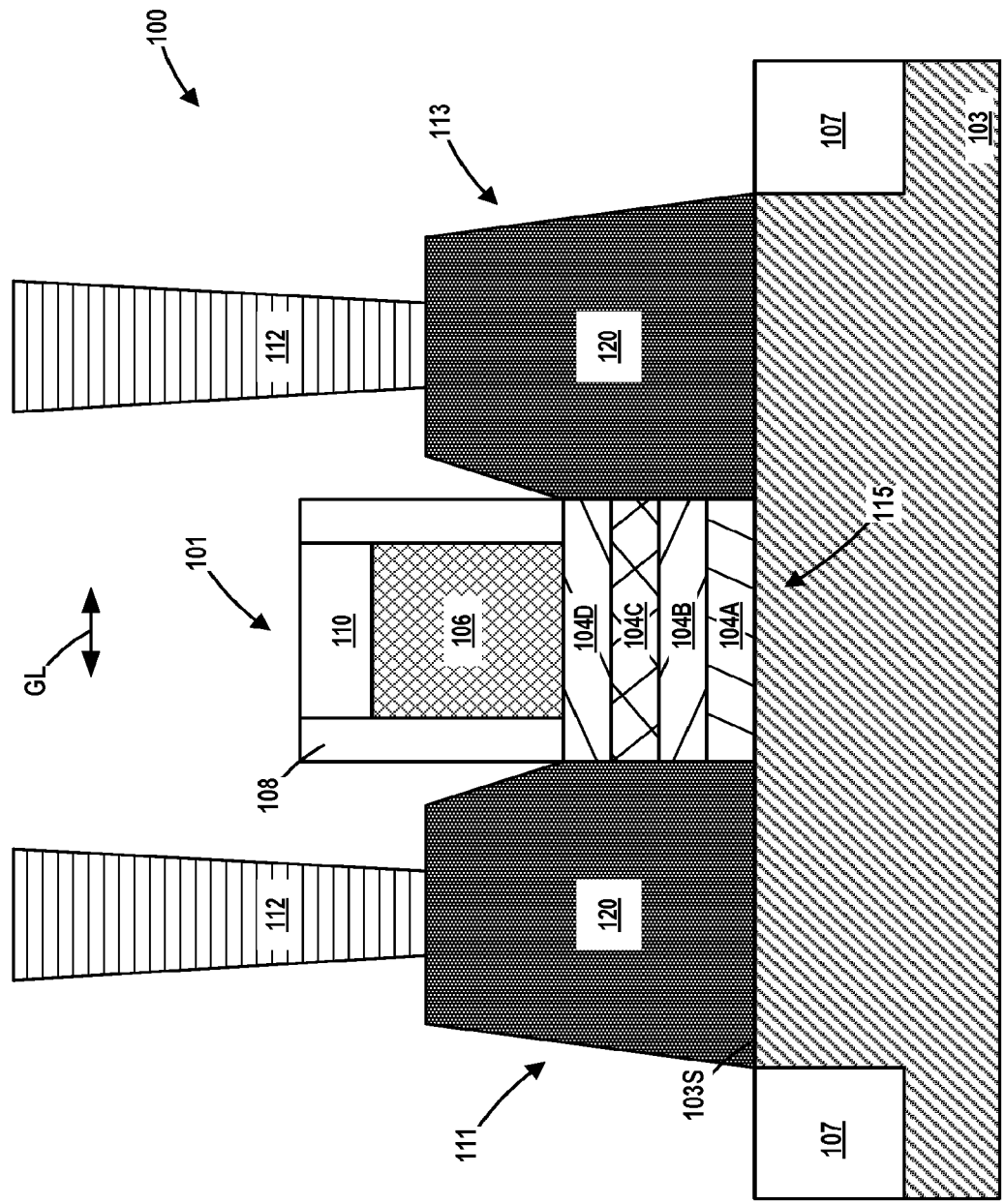

FIG. 9 depicts another embodiment of a transistor device 100 disclosed herein that comprises as least one layer of 2D material 104. However, relative to the embodiment shown in FIG. 8, in the embodiment shown in FIG. 9, the SOI substrate 102 has been replaced with the above-described bulk semiconductor substrate 103. In the planar transistor device 100 shown in FIG. 9, the lowermost 2D material layer 104A of the four illustrative 2D material layers 104A-104D is formed on and in contact with the upper surface 103S of the bulk semiconductor substrate 103. In this illustrative example, at least some portion of one or more of the four illustrative 2D material layers 104A-104D (perhaps in combination with a portion of the bulk semiconductor substrate 103) define the channel region 115 for the planar transistor device 100.

FIGS. 10-13 depict one illustrative process flow for forming the embodiments of the planar transistor device 100 shown in FIGS. 8-9. However, FIGS. 10-13 include a representative substrate 105 that is intended to be representative of either the SOI substrate 102 or the bulk semiconductor substrate 103. Accordingly, the upper surface 105S of the representative substrate 105 should be understood to be representative of the upper surface 102S of the active layer 102C of the SOI substrate 102 or the upper surface 103S of the bulk semiconductor substrate 103.

Figure 10:
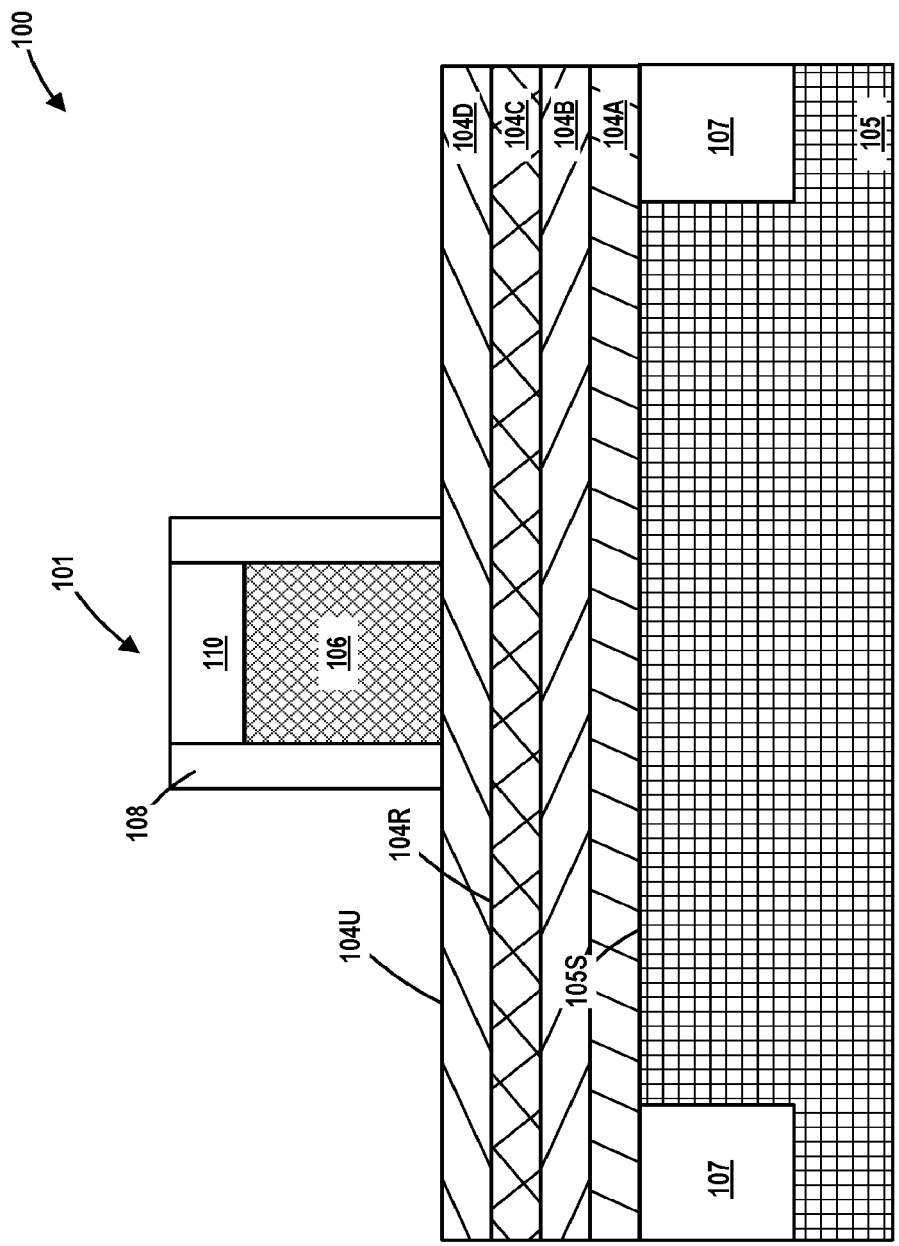

FIG. 10 depicts the device 100 after several process operations were performed. First, in one illustrative process flow, the above-described isolation structure 107 was formed in the representative substrate 105. Also depicted in FIG. 10 are the four above-described illustrative 2D material layers 104A-104D that are positioned above the upper surface 105S of the representative substrate 105. Next, the above-described gate 101 was formed above the uppermost 2D material layer 104D using traditional manufacturing techniques.

Figure 11:
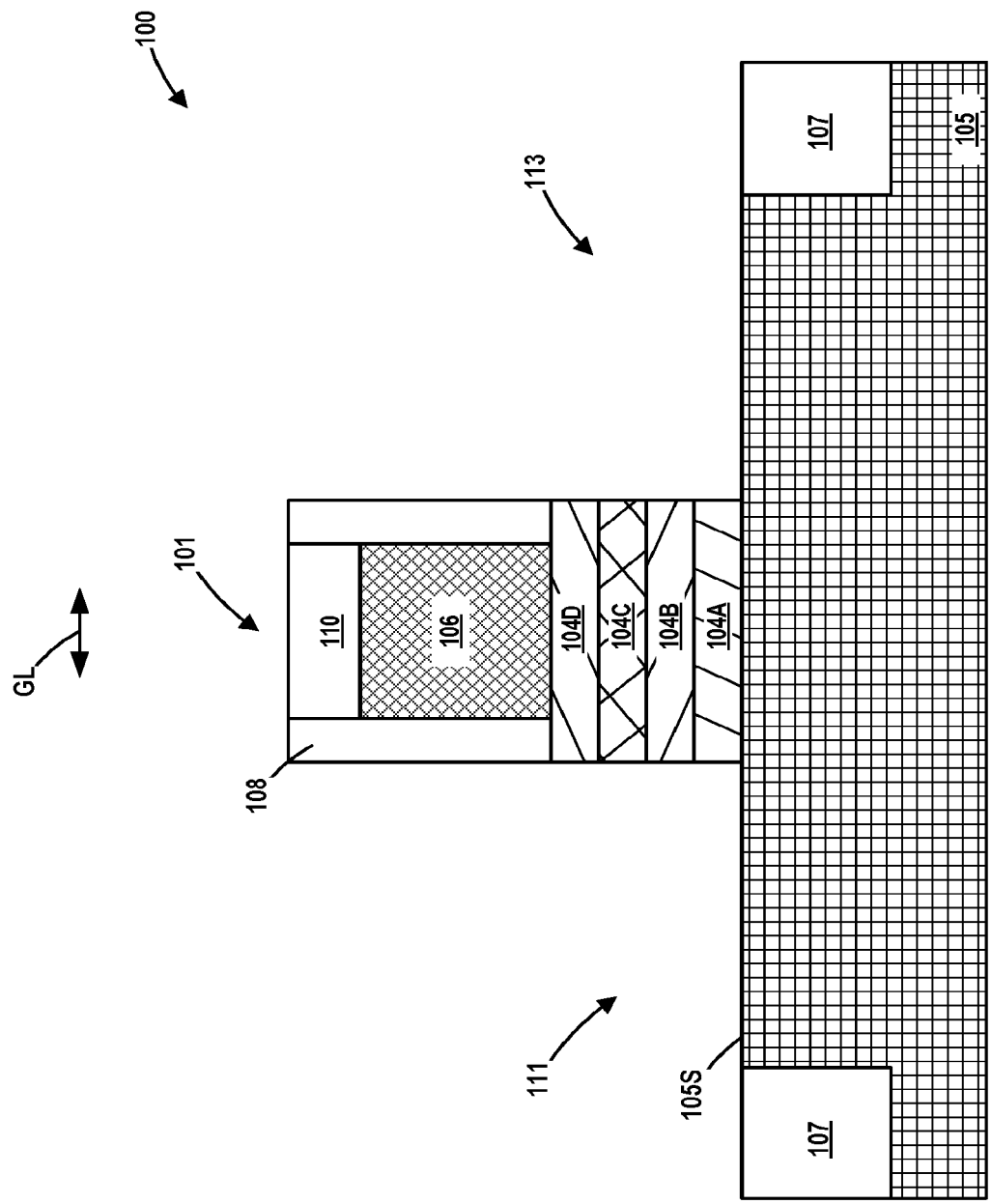

FIG. 11 depicts the planar transistor device 100 after one or more anisotropic etching processes were performed to remove exposed portions of the 2D material layers 104A-104D that are not protected by the gate 101. This process operation exposes the upper surface 105S of the representative substrate 105 in the source region 111 and the drain region 113 of the transitory device 100.

Figure 12:
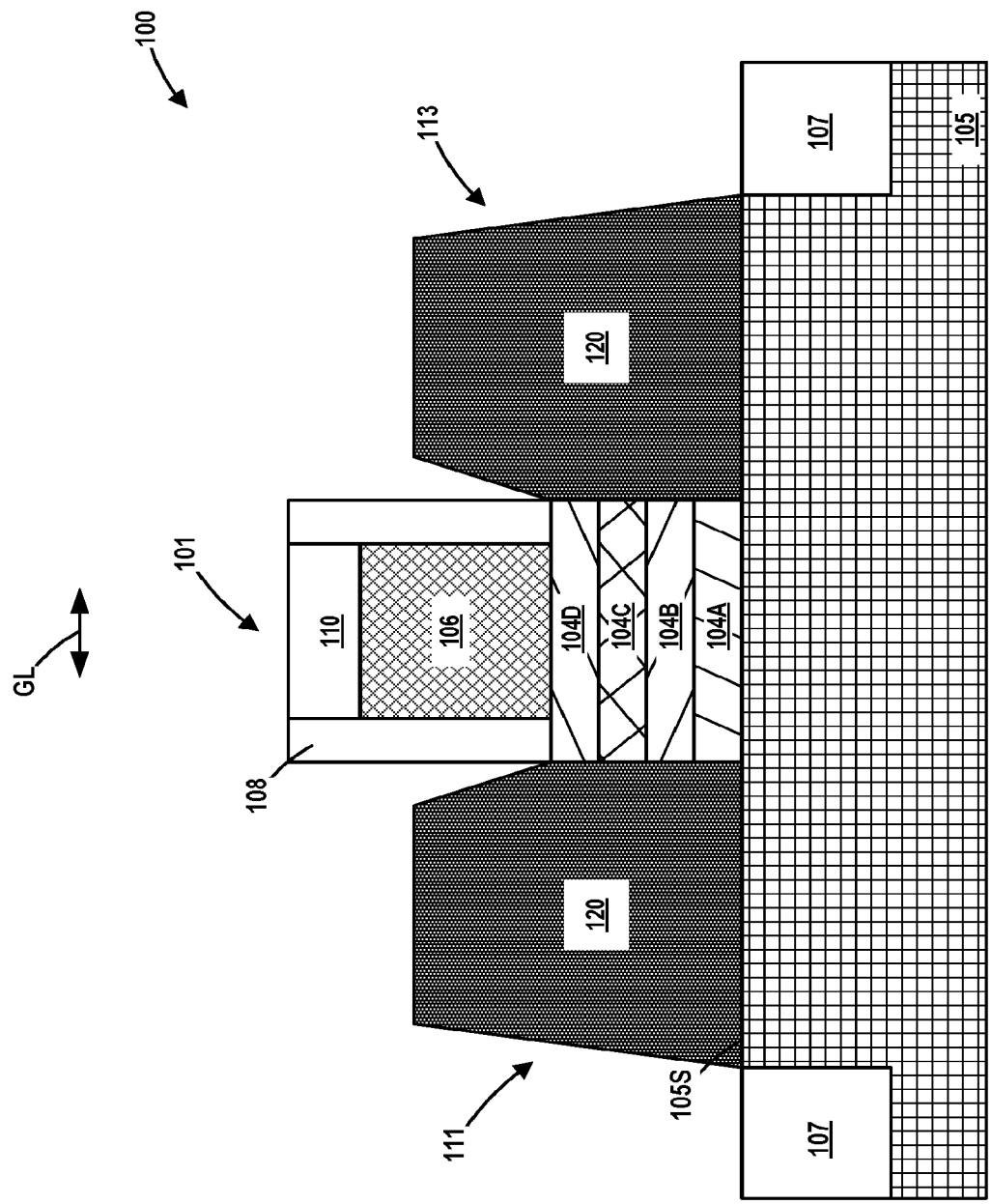

FIG. 12 depicts the device 100 after the above-described regions of epi semiconductor material 120 were formed in the source region 111 and the drain region 113 of the device 100. Note that the epi semiconductor material 120 is formed on and in contact with at least one of the exposed edge surfaces of the 2D material layers 104A-104D positioned in the channel region 115 of the device 100. In one illustrative embodiment, the regions of epi semiconductor material 120 are formed on and in contact with exposed edges of all of the 2D material layers 104A-104D positioned in the channel region 115 of the device 100.

Figure 13:
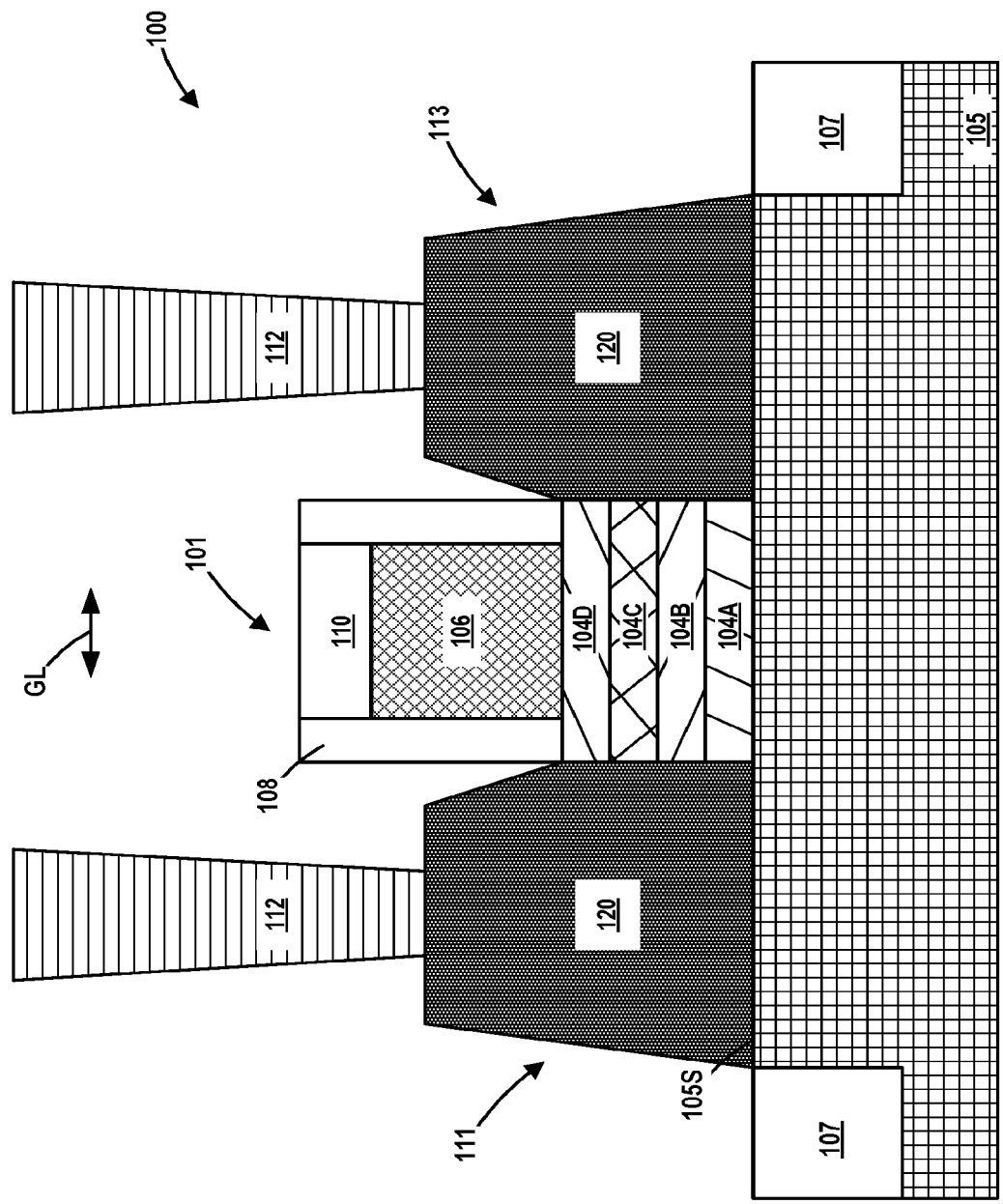

FIG. 13 depicts the planar transistor device 100 after the above-described conductive source/drain contact structures 112 were formed on the planar transistor device 100 so as conductively contact the regions of epi semiconductor material 120. Of course, as before, various layers of insulating material (not shown) were formed above the upper surface 105S of the representative substrate 105 and the regions of epi semiconductor material 120 prior to the formation of the conductive source/drain contact structures 112.

Figure 14:
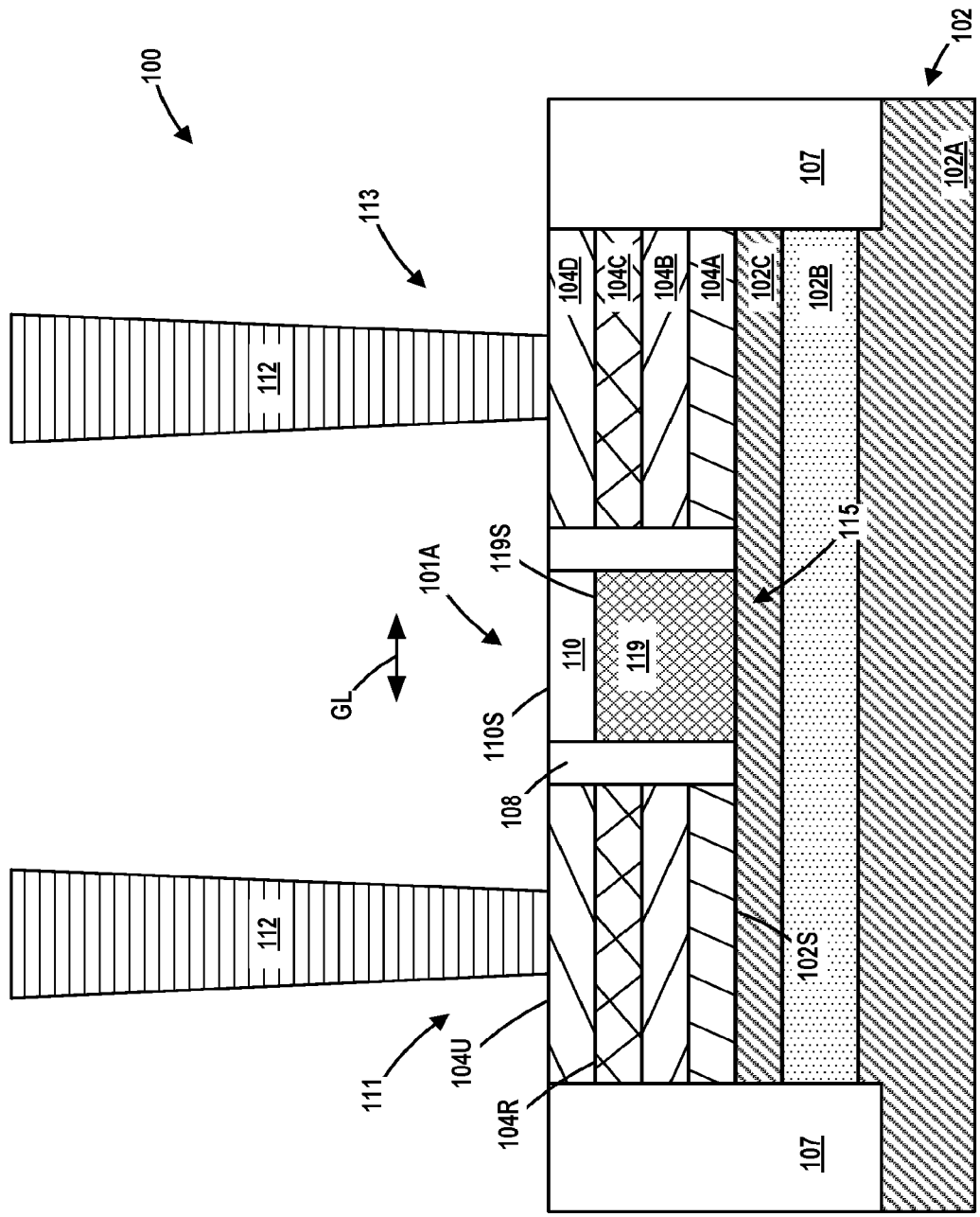

FIG. 14 depicts yet another embodiment of a planar transistor device 100 disclosed herein. In the illustrative embodiment of the planar transistor device 100 disclosed in FIG. 14, the above-described plurality of 2D material layers 104A-104D are positioned above the upper surface 102S of the SOI substrate 102 in the general area of the source region 111 and the drain region 113 of the planar transistor device 100, while the channel region 115 is substantially free of any of the 2D material layers 104. Also depicted in FIG. 13 is the above-described isolation structure 107 that extends through the 2D material layers 104A-104D and into the base semiconductor layer 102A of the SOI substrate 102. Also depicted in FIG. 14 is a gate structure 119, the above-described gate cap 110 and the above-described sidewall spacer 108. Collectively, the gate structure 119, the gate cap 110 and the sidewall spacer 108 define a gate 101A. As will be appreciated by those skilled in the art after a complete reading of the present application, if desired, the gate structure 119 may be the final gate structure for the planar transistor device 100 or it may serve as a sacrificial gate structure that may later be replaced. In the illustrative process flow disclosed below, the gate structure 119 will be the final gate structure for the planar transistor device 100. The sidewall spacer 108 laterally separates the final gate structure from the 2D material layers 104A-104D. As is common, the gate structure 119 may comprise a layer of gate insulation material (not separately shown), e.g., silicon dioxide, hafnium oxide, a high-k material (i.e., a material having a k value of 10 or greater) and one or more layers of conductive material, e.g., polysilicon, a metal, a metal-containing material, a work function adjusting material, etc., (not separately shown) that function as the gate electrode of the gate structure 119. Also shown in FIG. 14 is a plurality of the above-described conductive source/drain contact structures 112 that contact the uppermost of the 2D material layers 104 in the source region 111 and the drain region 113.

Figure 15:
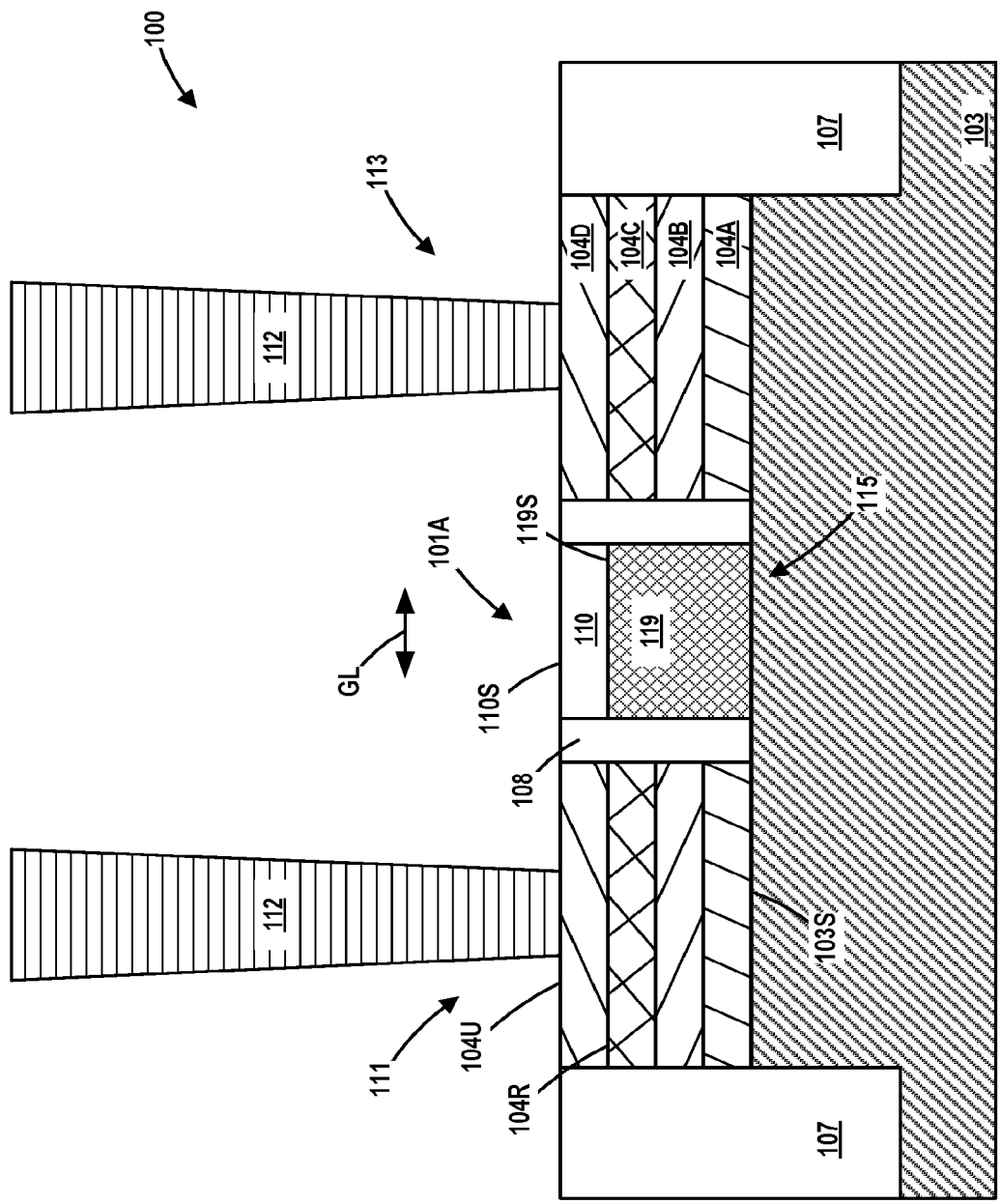

FIG. 15 depicts yet another illustrative embodiment of a planar transistor device 100 disclosed herein that is similar to the planar transistor device 100 shown in FIG. 14. However, relative to the embodiment shown in FIG. 14, the SOI substrate 102 has been replaced with the above-described bulk semiconductor substrate 103. In the planar transistor device 100 shown in FIG. 15, the lowermost 2D material layer 104A of the four illustrative 2D material layers 104A-104D is formed on and in contact with the upper surface 103S of the bulk semiconductor substrate 103.

It should also be noted that, in the embodiments shown in FIGS. 14 and 15, the upper surface 104U of the uppermost layer 104D of the plurality of 2D material layers 104 in the source and drain regions are substantially co-planar with an upper surface 110S of the gate cap 110. Additionally, with respect to these embodiments, the upper surface 104U of the uppermost layer 104D of the plurality of 2D material layers 104 in the source and drain regions is positioned at a level that is above a level of an upper surface 119S of the final gate structure 119.

FIGS. 16-22 depict one illustrative process flow for forming the embodiments of the planar transistor device 100 shown in FIGS. 14-15. However, FIGS. 16-22 include the above-described representative substrate 105 that is, in this example, intended to be representative of either the SOI substrate 102 or the bulk semiconductor substrate 103. Accordingly, the upper surface 105S of the representative substrate 105 shown in FIGS. 16-22 should be understood to be representative of the upper surface 102S of the active layer 102C of the SOI substrate 102 or the upper surface 103S of the bulk semiconductor substrate 103.

Figure 16:
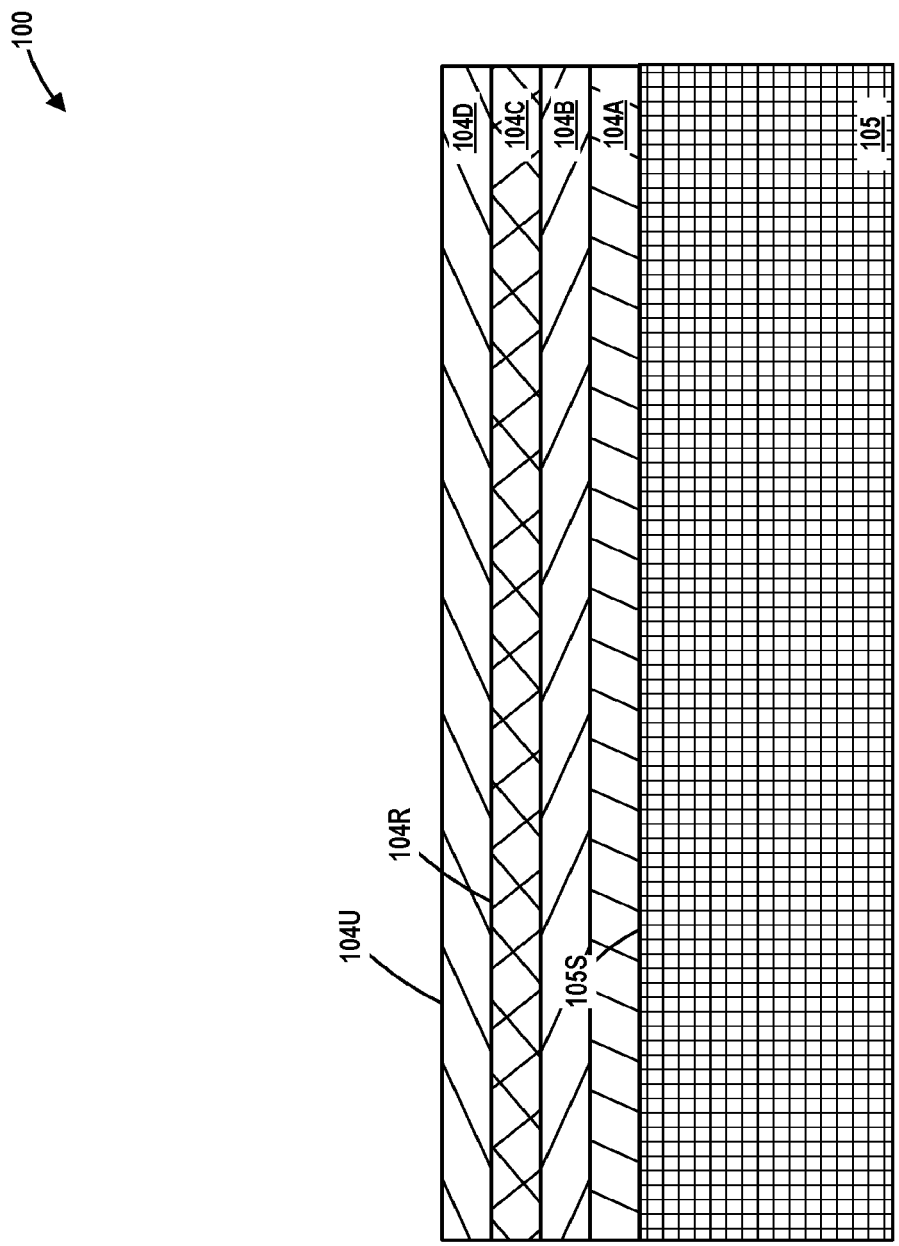

FIG. 16 depicts the device at a point in fabrication where the four illustrative 2D material layers 104A-104D are positioned above the upper surface 105S of the representative substrate 105. As before, in one illustrative process flow, the structure depicted in FIG. 16 may be produced by layer formation and cleaving techniques that are similar to known techniques for forming SOI substrates.

Figure 17:
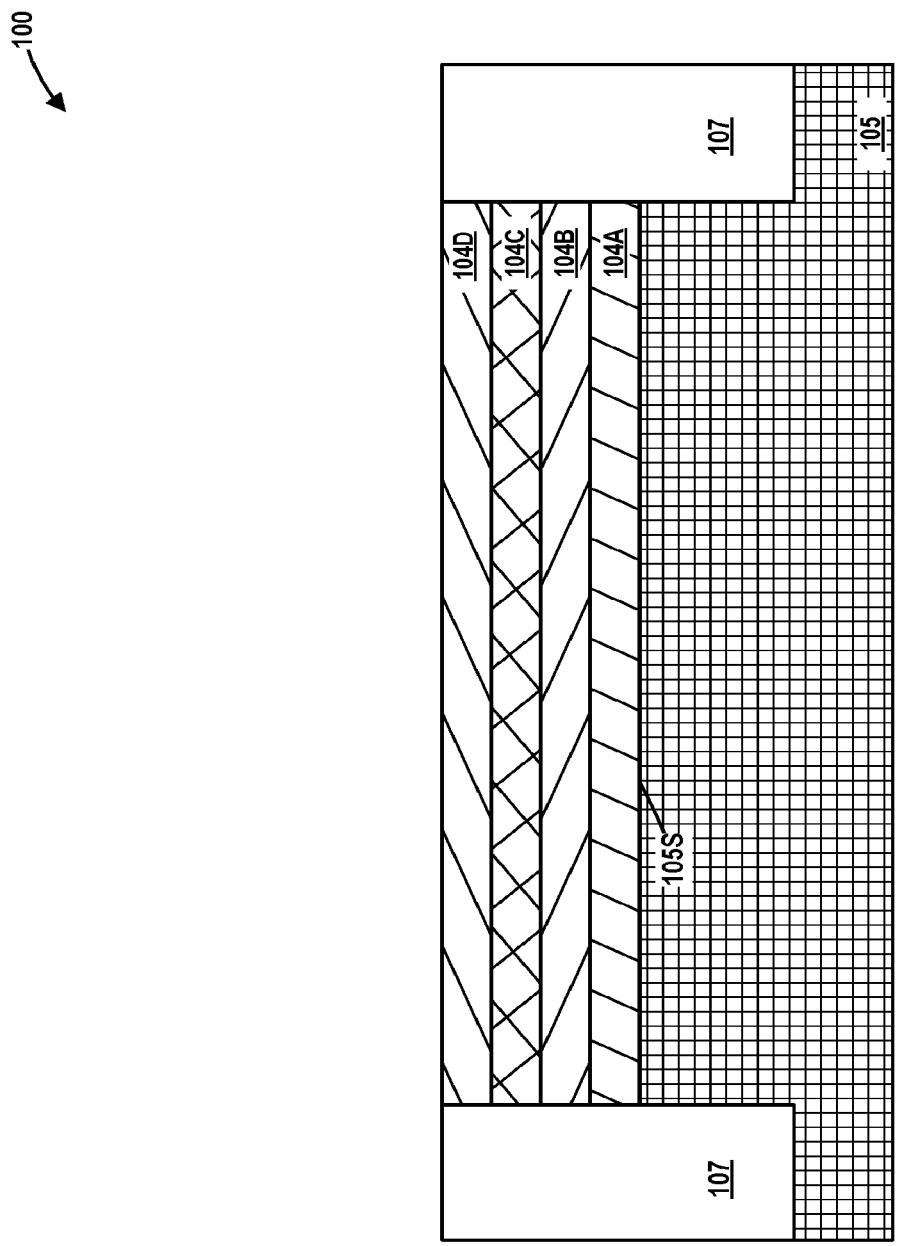

FIG. 17 depicts the planar transistor device 100 after the above-described isolation structure 107 was formed by performing traditional etching, deposition and planarization processes.

Figure 18:
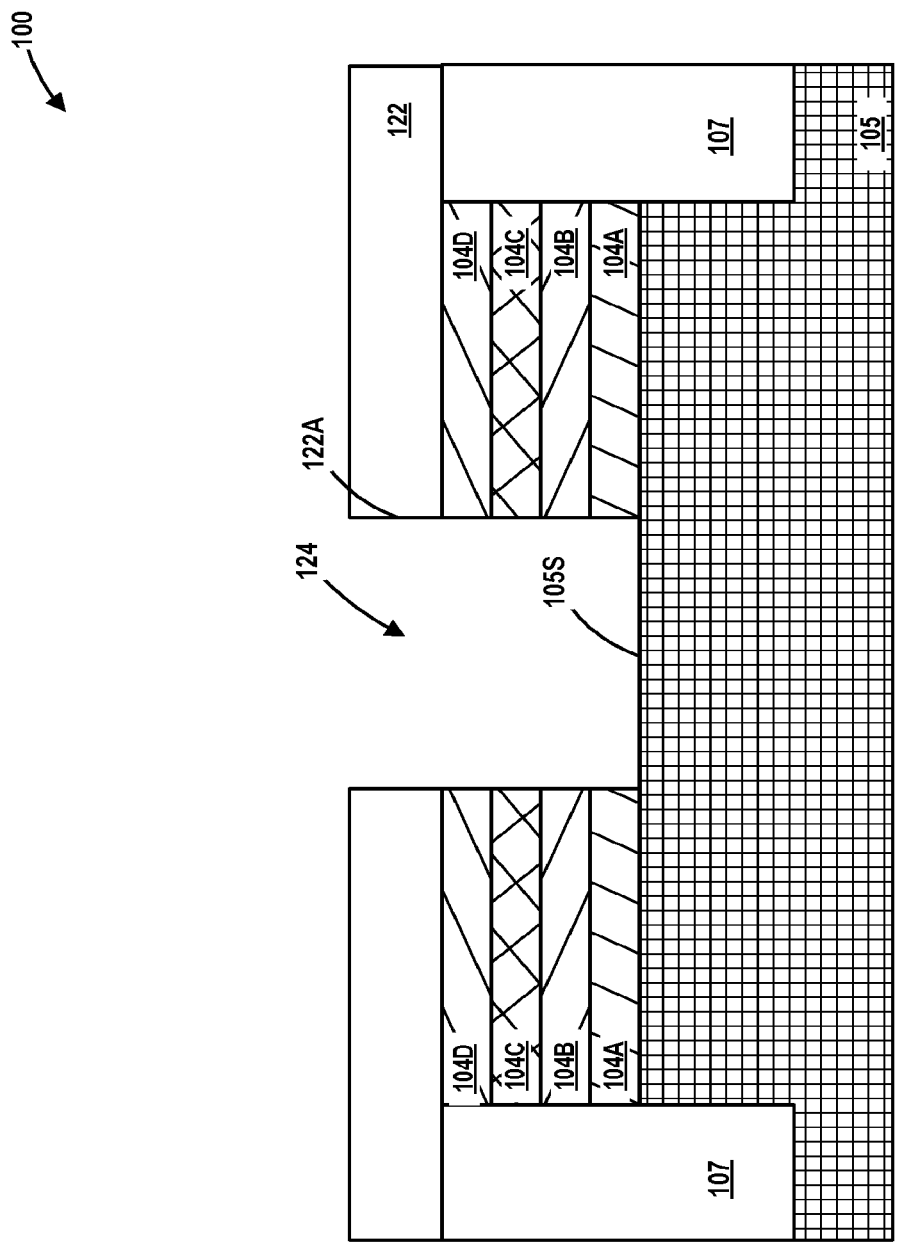

FIG. 18 depicts the planar transistor device 100 after several process operations were performed. First, a patterned etch mask 122, e.g., a patterned layer of photoresist, with an opening 122A was formed above the uppermost 2D material layer 104D using traditional manufacturing techniques. Thereafter, one or more etching processes were performed through the patterned etch mask to successively remove the exposed portions of all of the four illustrative 2D material layers 104A-104D shown in FIG. 18. In the depicted example, this process operation exposes the upper surface 105S of the representative substrate 105 and defines a gate cavity 124. As depicted, the gate cavity 124 is laterally bounded in the gate length direction by the etched end surfaces of the four illustrative 2D material layers 104A-104D and it is bounded in the gate width direction (into and out of the plane of the drawing page) by insulating material (not shown), e.g., silicon dioxide.

Figure 19:
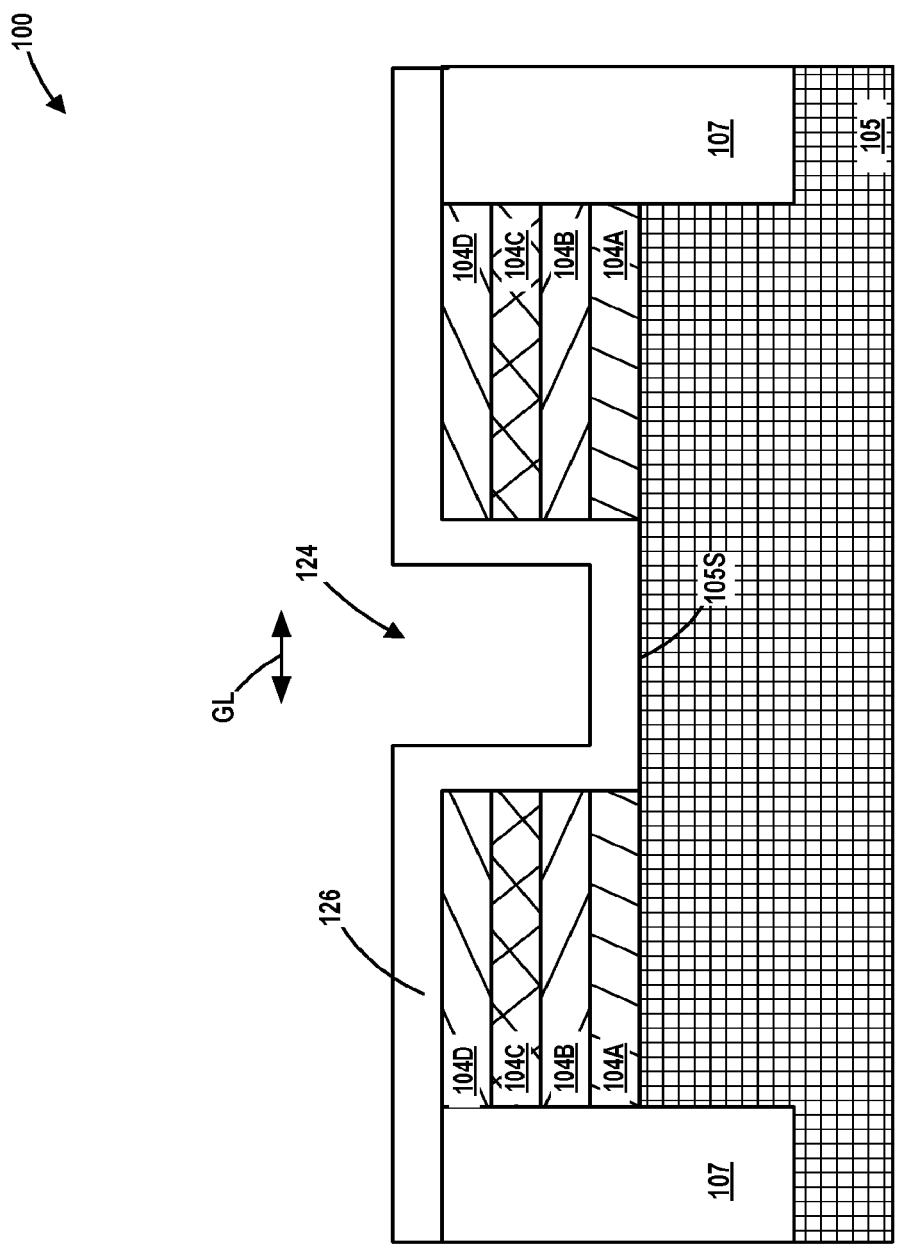

FIG. 19 depicts the planar transistor device 100 after several process operations were performed. First, the patterned etch mask 122 was removed. Thereafter, a conformal layer of spacer material 126 was formed above the representative substrate 105 and in the gate cavity 124. The layer of spacer material 126 may be of any desired thickness (as measured at its base) and it may be comprised of a variety of different materials, e.g., silicon dioxide, a low-k material, silicon nitride, SiCN, SiN, SiCO, and SiOCN, etc. The layer of spacer material 126 was formed on the entire inner surface sidewalls of the gate cavity 124 as well as on the upper surface 105S of the representative substrate 105.

Figure 20:
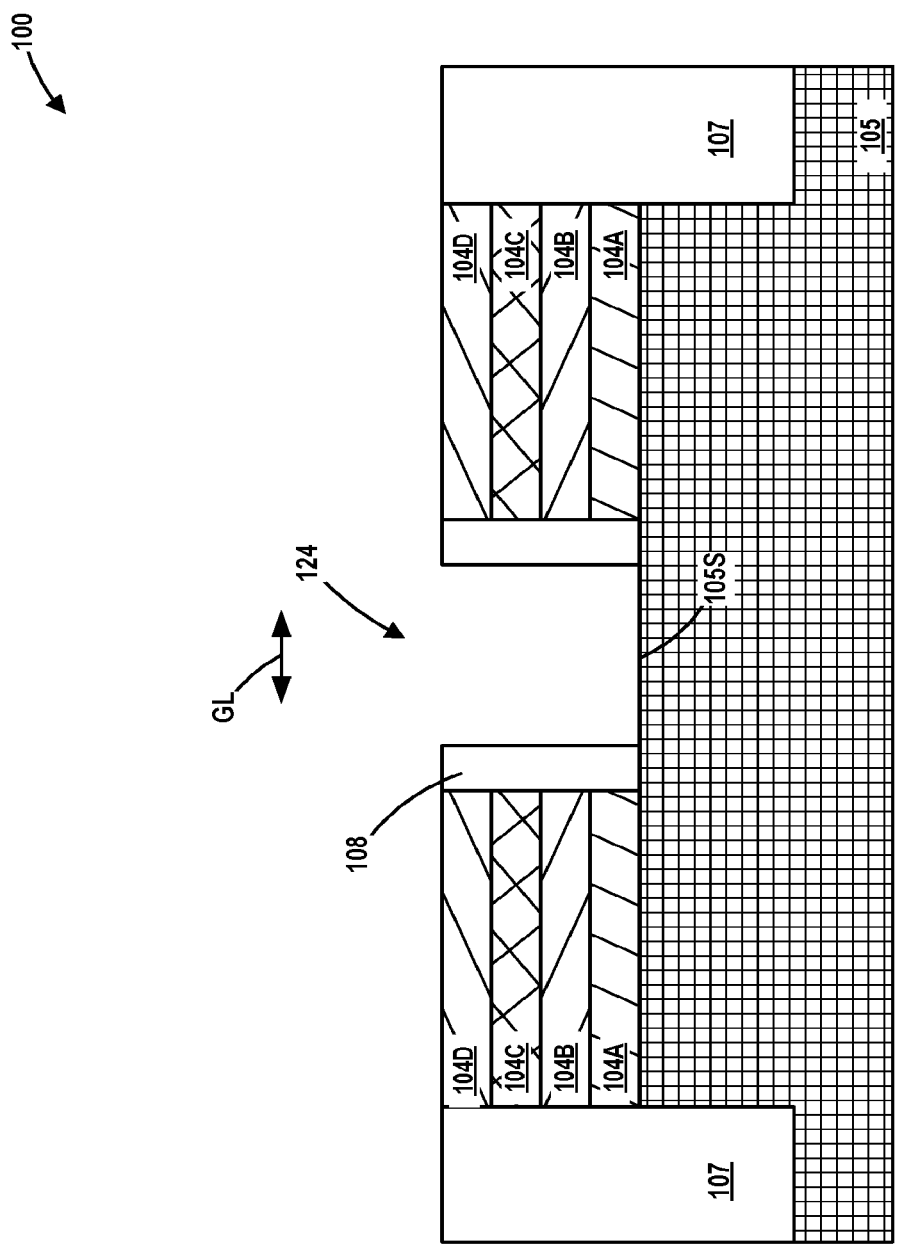

FIG. 20 depicts the planar transistor device 100 after an anisotropic etching process was performed to remove horizontally positioned portions of the layer of spacer material 126. This process operation results in the formation of the simplistically depicted internal sidewall spacer 108 that is formed on the entire inner surface sidewalls of the gate cavity 124. Although only a single internal sidewall spacer 108 is depicted in FIG. 20, in practice, more than one internal sidewall spacer may be formed within the gate cavity 124. The internal sidewall spacer 108 may be of any desired thickness (as measured at its base) and it may be comprised of a variety of different materials, e.g., silicon dioxide, a low-k material, silicon nitride, SiCN, SiN, SiCO, and SiOCN, etc.

Figure 21:
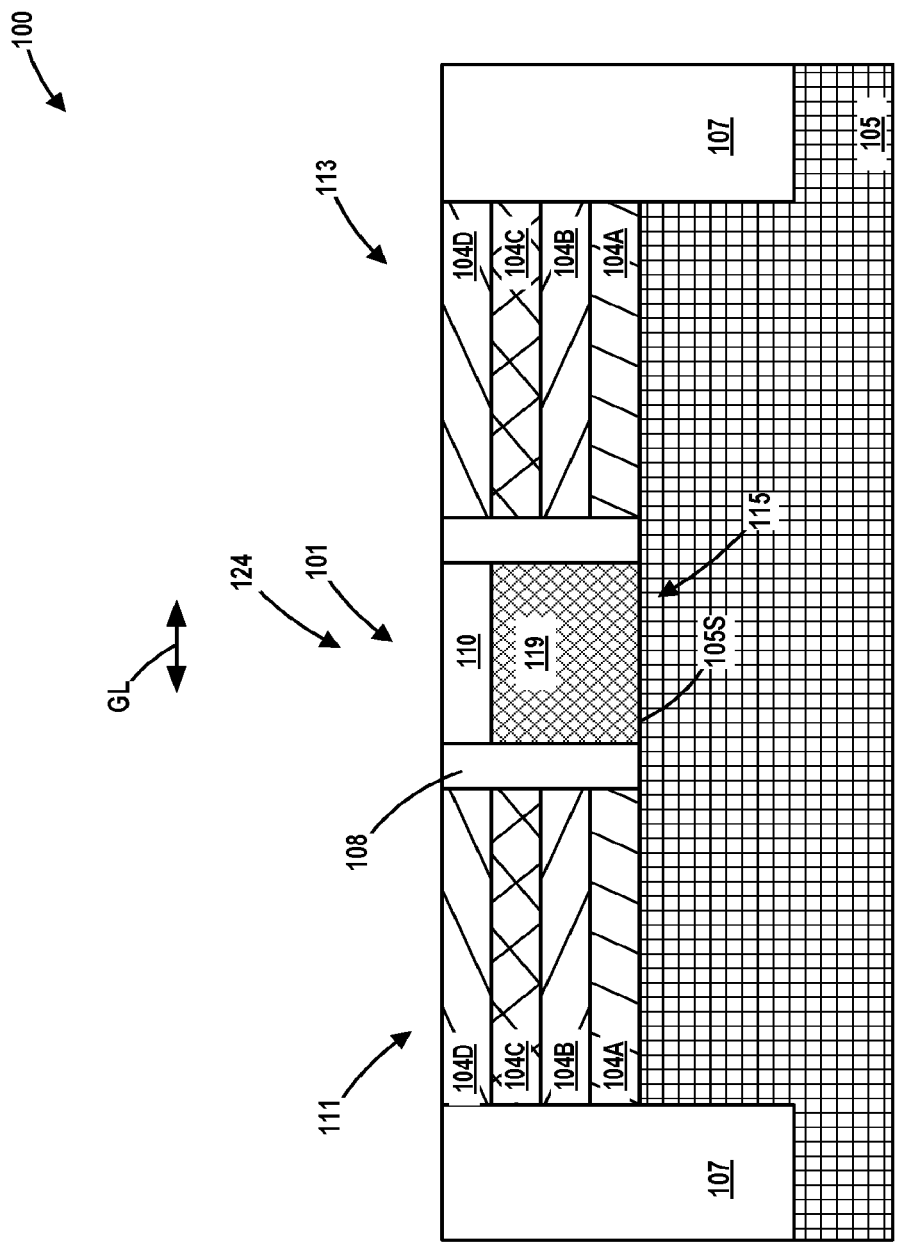

FIG. 21 depicts the planar transistor device 100 after several process operations were performed. First, at least one conformal deposition process was performed to form a conformal gate insulation layer (not separately shown) in the gate cavity 124 and above the upper surface of the 2D material layer 104D. Thereafter, one or more conformal deposition processes were performed to form one or more conformal layers of conductive material in the gate cavity 124 above the conformal gate insulation layer and above the upper surface of the of the 2D material layer 104D. At that point, a blanket-deposition process may be performed to over-fill any remaining un-filled portions of the gate cavity 124 with a conductive material such as, for example, tungsten. At that point, one or more CMP or etch-back process operations were performed to remove the material positioned outside of the gate cavity 124 and above the upper surface of the 2D material layer 104D. Then, a recess etching process was performed on the materials within the gate cavity 124 to reduce the overall height of those materials so as to make room for the gate cap 110. Thereafter, a blanket deposition process was performed to form a layer of gate cap material that overfills the gate cavity 124 above the recessed materials therein. At that point, a CMP process was performed to remove excess amounts of the layer of gate cap material positioned above the upper surface of the 2D material layer 104D.

Of course, if desired, at some point in the process flow, in one illustrative embodiment, one or more ion implantation processes may performed to form doped source/drain regions (not shown) that extend through the four illustrative 2D material layers 104A-104D in the source region 111 and drain region 113 and into the representative substrate 105. As before, other implant regions (not shown) may also be formed in the representative substrate 105, e.g., halo implant regions.

Figure 22:
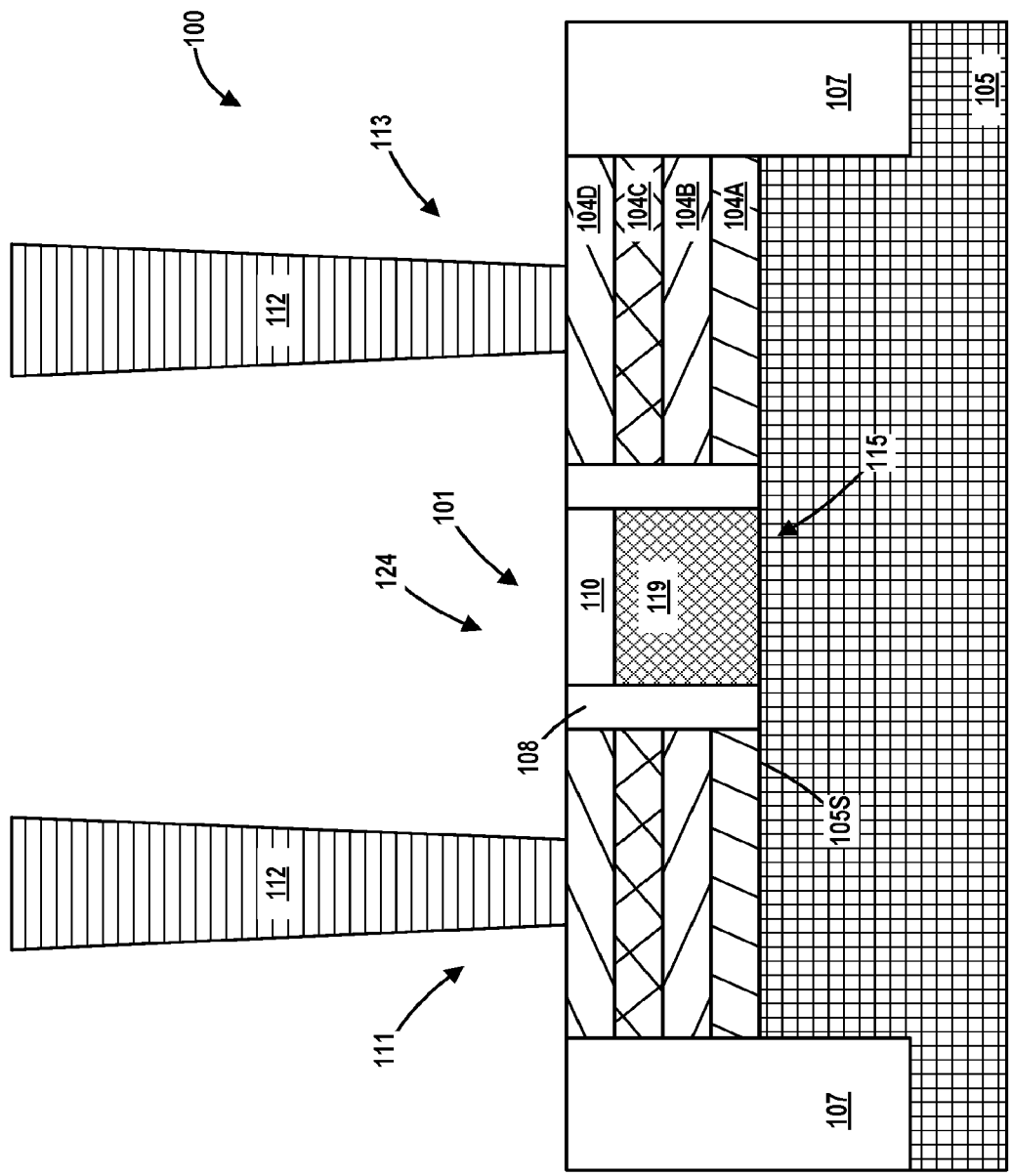

FIG. 22 depicts the planar transistor device 100 after the above-described conductive source/drain contact structures 112 were formed on the planar transistor device 100. Of course, various layers of insulating material (not shown) were formed above the upper surface 105S of the representative substrate 105 prior to the formation of the conductive source/drain contact structures 112.

As described above, the 2D material layers 104 disclosed herein have a periodic crystallographic pattern. In one illustrative embodiment, where the various embodiments of the planar transistor devices 100 disclosed herein comprise at least two of the 2D material layers 104, the periodic crystallographic pattern of vertically adjacent 2D material layers 104 may be rotated or "twisted" relative to one another so as to improve the electrical performance of the combination of the at least two layers of the 2D material 104, such as, for example, charge carrier mobility, gate control, gate capacitance, short channel effects, etc. The amount of or degree of relative rotation between the 2D material layers 104 may be determined with respect to any plane of reference. For example, when the 2D material layers 104 are formed in the source region 111 of the planar transistor device 100, such a plane of reference may be a vertically oriented plane that is parallel to the gate structure and extends in the gate width direction of the device. Other reference planes are, or course possible. Moreover, the direction of relative rotation between the 2D material layers 104 (clockwise or counterclockwise) may vary as well. Of course, depending upon the material selected for the 2D material layers 104, e.g., graphene or MoS$_2$, the periodic crystallographic pattern of the 2D material layers may be different. In FIGS. 23-28, each of the 2D material layers 104 is depicted as being comprised of silicon.

Figure 23:
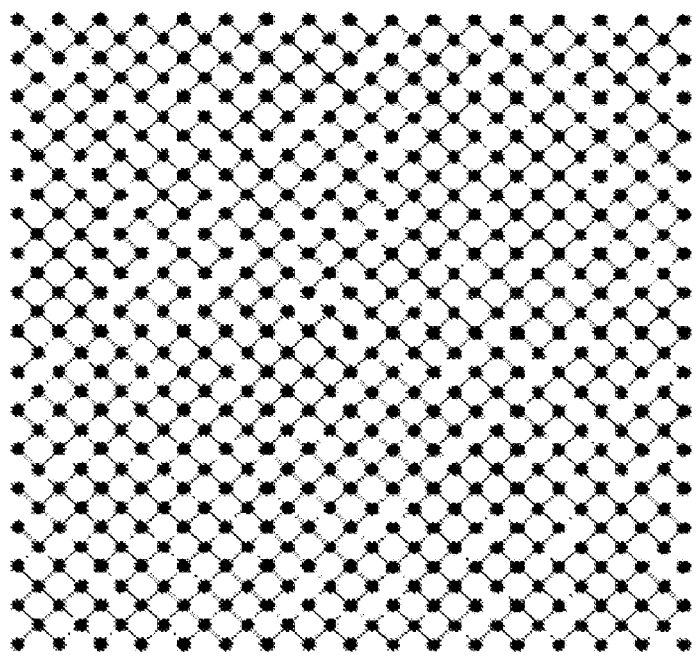

FIG. 23 is a top view of a single layer of 2D material 104 disclosed herein showing the periodic crystallographic pattern of each of the 2D material layers 104.

Figure 24:
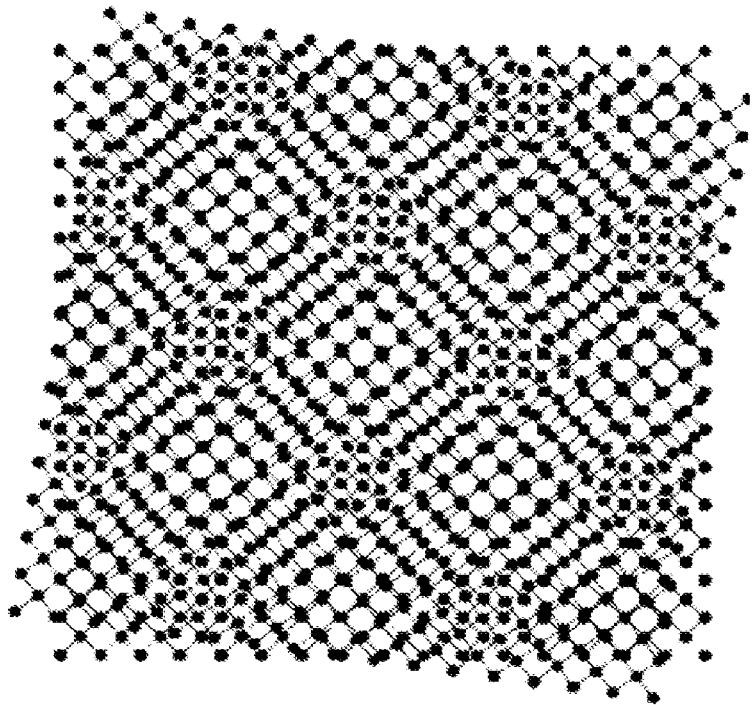

FIG. 24 is a plan view of two of the 2D material layers 104 in a stacked arrangement wherein the uppermost of the two 2D material layers 104 is rotated about 8° in a clockwise direction relative to the bottom layer of the two 2D material layers 104.

Figure 25:
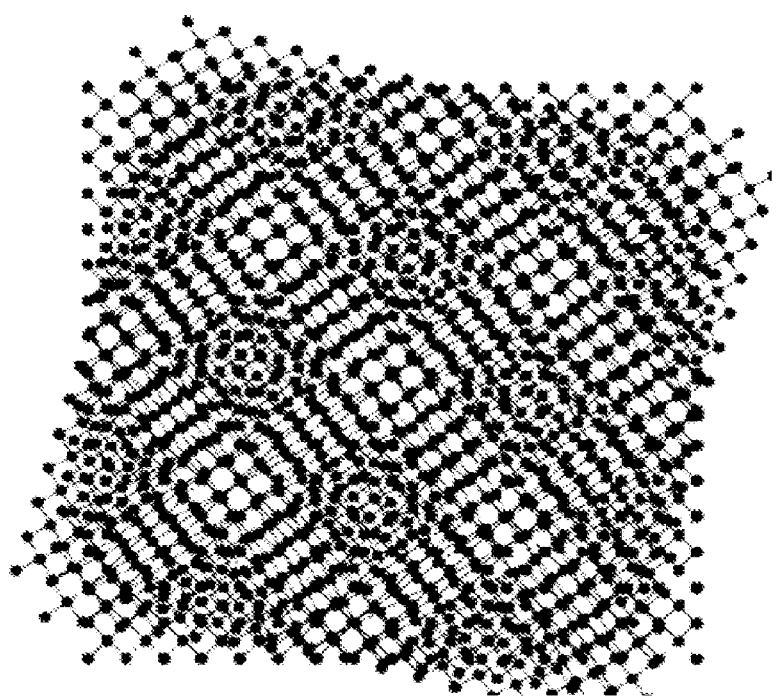

FIG. 25 is a plan view of three of the 2D material layers 104 in a stacked arrangement wherein the second of the three 2D material layers 104 is rotated about 8° in a clockwise direction relative to the bottom layer of the three 2D material layers 104 and the uppermost of the three 2D material layers 104 is rotated about 8° in a clockwise direction relative to the second layer of the three 2D material layers 104. Thus, in relative terms, the uppermost of the three 2D material layers 104 is rotated in a clockwise direction about 16° relative to the bottom layer of the three 2D material layers 104.

Figure 26:
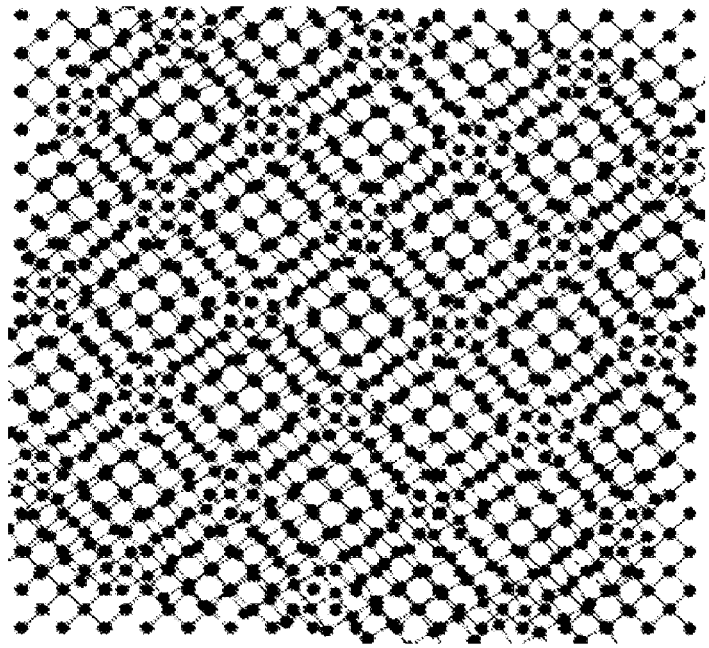

FIG. 26 is a plan view of two of the 2D material layers 104 in a stacked arrangement wherein the uppermost of the two 2D material layers 104 is rotated about 12° in a clockwise direction relative to the bottom layer of the two 2D material layers 104.

Figure 27:
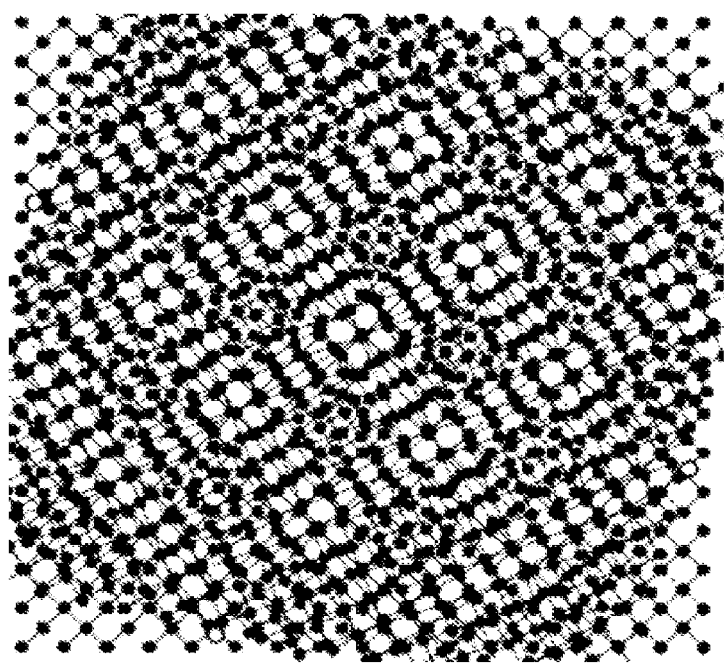

FIG. 27 is a plan view of three of the 2D material layers 104 in a stacked arrangement wherein the second of the three 2D material layers 104 is rotated about 12° in a clockwise direction relative to the bottom layer of the three 2D material layers 104 and the uppermost of the three 2D material layers 104 is rotated about 12° in a clockwise direction relative to the second layer of the three 2D material layers 104. Thus, in relative terms, the uppermost of the three 2D material layers 104 is rotated in a clockwise direction about 24° relative to the bottom layer of the three 2D material layers 104.

Figure 28:
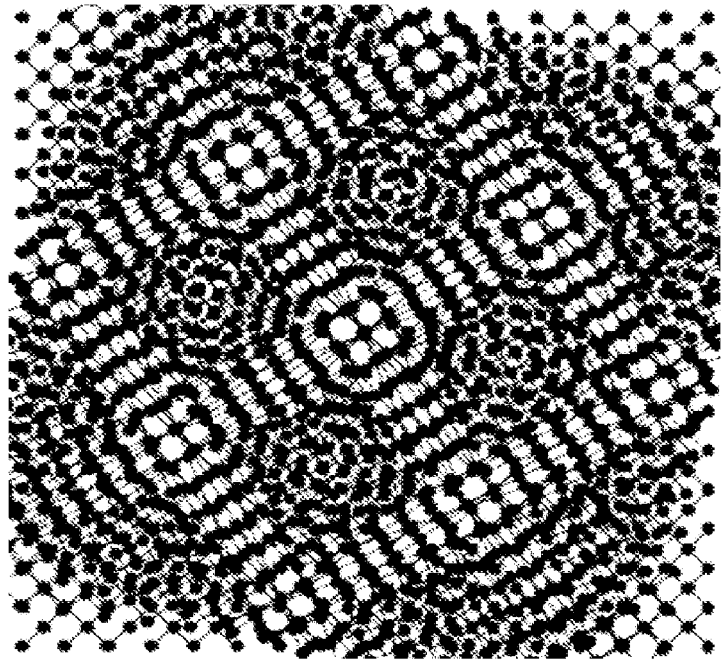

FIG. 28 is a plan view of a stack of the 2D material layers 104 that is similar to that shown in FIG. 25 except that a fourth 2D material layer has been positioned above the uppermost of the three of the 2D material layers 104 shown in FIG. 25, and the fourth layer of 2D material shown in FIG. 28 has been rotated about 8° in a clockwise direction relative to the third layer of the four 2D material layers 104 shown in FIG. 28. Thus, in relative terms, the uppermost of the four 2D material layers 104 shown in FIG. 28 is rotated in a clockwise direction about 24° relative to the bottom layer of the four 2D material layers 104 shown in FIG. 28.

Of course, as will be appreciated by those skilled in the art after a complete reading of the present application, the relative rotation between the 2D material layers 104 need not be constant for all of the 2D material layers 104 in a given stack of such materials. For example, the second layer of a four layer stack of materials may be rotated 7° relative to the bottom layer, the third layer of the stack may be rotated 15° relative to the second layer of the stack of material, and the fourth layer of the stack may be rotated 6° relative to the third layer of the stack of such materials. Additionally, the direction of relative rotation may be different for various layers in the stack of such three 2D material layers. Moreover, in some cases the direction of relative rotation among all of the 2D material layers within a given stack of such may be the same, but that may not be the case in all applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A planar transistor device comprising a gate having a gate length that extends in a gate length direction and a gate width that extends in a gate width direction, the transistor comprising:
   a gate structure positioned above a semiconductor substrate, the semiconductor substrate comprising a substantially planar upper surface;
   a gate cap on the gate structure;
   a channel region;
   a source region;
   a drain region; and
   a plurality of layers of a two-dimensional (2D) material in a vertically stacked layer and positioned in at least one of the source region and the drain region, wherein the at least one layer of 2D material has a substantially planar upper surface, a substantially planar bottom surface and a substantially uniform vertical thickness across an entire length of the at least one layer of 2D material in the gate length direction and across an entire width of the at least one layer of 2D material in the gate width direction, wherein the substantially planar upper surface and the substantially planar bottom surface of the at least one layer of 2D material are positioned approximately parallel to a substantially planar surface of the semiconductor substrate wherein an uppermost layer of the plurality of layers of 2D material in the source region and an uppermost layer of the plurality of layers of 2D material in the drain region are substantially co-planar with an upper surface of the gate cap; and
   wherein the gate structure is positioned on a substantially planar upper surface of the semiconductor substrate and wherein the at least one layer of 2D material is positioned across an entirety of the source region and across an entirety of the drain region, wherein a portion of the semiconductor substrate positioned below the gate structure comprises the channel region and wherein the channel region is substantially free of the of the at least one layer of 2D material.

2. The planar transistor device of claim 1, wherein the device further comprises a first conductive source/drain contact structure that is conductively coupled to an uppermost layer of the plurality of layers of 2D material in the source region and a second conductive source/drain contact structure that is conductively coupled to an uppermost layer of the plurality of layers of 2D material in the drain region.

3. The planar transistor device of claim 2, wherein at least one sidewall spacer is positioned between the gate structure and the at least one layer of 2D material in the source region and the at least one layer of 2D material in the drain region.

4. The planar transistor device of claim 2, wherein an uppermost layer of the plurality of layers of 2D material in the source region and an uppermost layer of the plurality of layers of 2D material in the drain region has an upper surface that is positioned at a level that is above a level of an upper surface of the gate structure.

5. The planar transistor device of claim 2, further comprising a first isolation structure with a first portion adjacent the plurality of layers of 2D material in the source region and a second portion adjacent a first side of the channel region; and
   a second isolation structure with a first portion adjacent the plurality of layers of 2D material in the drain region and a second portion adjacent a second side of the channel region.

6. The planar transistor device of claim 2, wherein each of the plurality of layers of 2D material have a substantially same vertical thickness.

7. A planar transistor device comprising a gate having a gate length that extends in a gate length direction and a gate width that extends in a gate width direction, the transistor comprising:
   a gate structure positioned above a semiconductor substrate, the semiconductor substrate comprising a substantially planar upper surface;
   a gate cap on the gate structure;
   a channel region;
   a source region;
   a drain region; and
   a plurality of layers of a two-dimensional (2D) material that is in a vertically stacked layer and positioned in at least one of the source region and the drain region, wherein the at least one layer of 2D material has a substantially planar upper surface, a substantially planar bottom surface and a substantially uniform vertical thickness across an entire length of the at least one layer of 2D material in the gate length direction and across an entire width of the at least one layer of 2D material in the gate width direction, wherein the substantially planar upper surface and the substantially planar bottom surface of the at least one layer of 2D material are positioned approximately parallel to a substantially planar surface of the semiconductor substrate wherein an uppermost layer of the plurality of layers of 2D material in the source region and an uppermost layer of the plurality of layers of 2D material in the drain region are substantially co-planar with an upper surface of the gate cap, wherein the plurality of layers of 2D material extends across an entirety of the source region, an entirety of the channel region and an entirety of the drain region, and wherein the device further comprises a first conductive source/drain contact structure that is conductively coupled to an uppermost layer of the plurality of layers of 2D material in the source region and a second conductive source/drain contact structure that is conductively coupled to an uppermost layer of the plurality of layers of 2D material in the drain region.

8. The planar transistor device of claim 7, wherein at least one sidewall spacer is positioned between the gate structure and the plurality of layers of 2D material in the source region and the plurality of layers of 2D material in the drain region.

9. The planar transistor device of claim 7, further comprising a first isolation structure with a first portion adjacent the plurality of layers of 2D material in the source region and a second portion adjacent a first side of the channel region; and a second isolation structure with a first portion adjacent the plurality of layers of 2D material in the drain region and a second portion adjacent a second side of the channel region.

10. The planar transistor device of claim 9, wherein a bottommost surface of the first isolation structure and a bottommost surface of the second isolation structure are each beneath a bottommost surface of the plurality of layers of 2D material.

11. The planar transistor device of claim 7, further comprising a pair of isolation structures on opposing horizontal sides of the channel region and beneath the plurality of layers of 2D material.

12. The planar transistor device of claim 7, wherein each of the plurality of layers of 2D material have a substantially same vertical thickness.

13. A planar transistor device comprising a gate having a gate length that extends in a gate length direction and a gate width that extends in a gate width direction, the transistor comprising:

a gate structure positioned above a semiconductor substrate, the semiconductor substrate comprising a substantially planar upper surface, the gate structure comprising an upper surface;

a gate cap on the gate structure;

a channel region;

a source region;

a drain region;

a plurality of layers of two-dimensional (2D) material in a vertically stacked layer, that is positioned across an entirety of the source region and across an entirety of the drain region, wherein the channel region is substantially free of the plurality of layers of 2D material, wherein each of the plurality of layers of 2D material has a substantially planar upper surface, a substantially planar bottom surface and a substantially uniform vertical thickness across an entire length of the plurality of layers of 2D material in the gate length direction and across an entire width of the plurality of layers of 2D material in the gate width direction, wherein the substantially planar upper surface and the substantially planar bottom surface of each of the plurality of layers of 2D material are positioned approximately parallel to the substantially planar upper surface of the semiconductor substrate, wherein an uppermost layer of the plurality of layers of 2D material in the source region and an uppermost layer of the plurality of layers of 2D material in the drain region are substantially co-planar with an upper surface of the gate cap; and a sidewall spacer positioned adjacent the gate structure between the plurality of layers of 2D material in the source region and the plurality of layers of 2D material in the drain region.

14. The planar transistor device of claim 13, wherein the plurality of layers of 2D material positioned is in a vertically stacked arrangement and wherein the device further comprises a first conductive source/drain contact structure that is conductively coupled to an uppermost layer of the plurality of layers of 2D material in the source region and a second conductive source/drain contact structure that is conductively coupled to an uppermost layer of the plurality of layers of 2D material in the drain region.

15. The planar transistor device of claim 13, wherein an uppermost layer of the plurality of layers of 2D material in the source region and an uppermost layer of the plurality of layers of 2D material in the drain region has an upper surface that is positioned at a level that is above a level of an upper surface of the gate structure.

16. The planar transistor device of claim 13, wherein the semiconductor substrate includes a semiconductor-on-insulator substrate.

17. The planar transistor device of claim 13, further comprising a first isolation structure with a first portion adjacent the plurality of layers of 2D material in the source region and a second portion adjacent a first side of the channel region; and a second isolation structure with a first portion adjacent the plurality of layers of 2D material in the drain region and a second portion adjacent a second side of the channel region.

18. The planar transistor device of claim 17, wherein a bottommost surface of the first isolation structure and a bottommost surface of the second isolation structure are each beneath a bottommost surface of the plurality of layers of 2D material.

19. The planar transistor device of claim 13, wherein each of the plurality of layers of 2D material have a vertical thickness that is substantially the same.

* * * * *